United States Patent
Haraguchi

(10) Patent No.: US 6,178,127 B1
(45) Date of Patent: Jan. 23, 2001

(54) SEMICONDUCTOR MEMORY DEVICE ALLOWING RELIABLE REPAIRING OF A DEFECTIVE COLUMN

(75) Inventor: Yoshiyuki Haraguchi, Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/546,648

(22) Filed: Apr. 10, 2000

(30) Foreign Application Priority Data

Sep. 28, 1999 (JP) .................................................. 11-273768

(51) Int. Cl.⁷ .................................................. G11C 29/00
(52) U.S. Cl. ...................................... 365/200; 365/230.03
(58) Field of Search .............................. 365/200, 230.03, 365/230.06, 225.7

(56) References Cited

U.S. PATENT DOCUMENTS

| 5,570,318 | * | 10/1996 | Ogawa | 365/200 |
| 5,617,365 | * | 4/1997 | Horiguchi et al. | 365/200 |
| 6,055,196 | * | 4/2000 | Takai | 365/200 |
| 6,067,260 | * | 5/2000 | Ooishi et al. | 365/200 |
| 6,094,381 | * | 7/2000 | Isa | 365/200 |

FOREIGN PATENT DOCUMENTS 9-91992    4/1997  (JP) .

* cited by examiner

*Primary Examiner*—Son Mai
(74) *Attorney, Agent, or Firm*—McDermott, Will & Emery

(57) ABSTRACT

A replacement IO program circuit is provided for each of memory blocks coupled commonly to a data bus of multiple bits, and a replacement column address program circuit is provided for a predetermined number of memory blocks. The state of use of a redundant column can be independently determined in each memory block, and the number of program circuits and the area occupied by the circuits are reduced. A semiconductor memory device includes a defective column repairing circuit allowing efficient use of the redundant column without increasing a chip area.

9 Claims, 19 Drawing Sheets

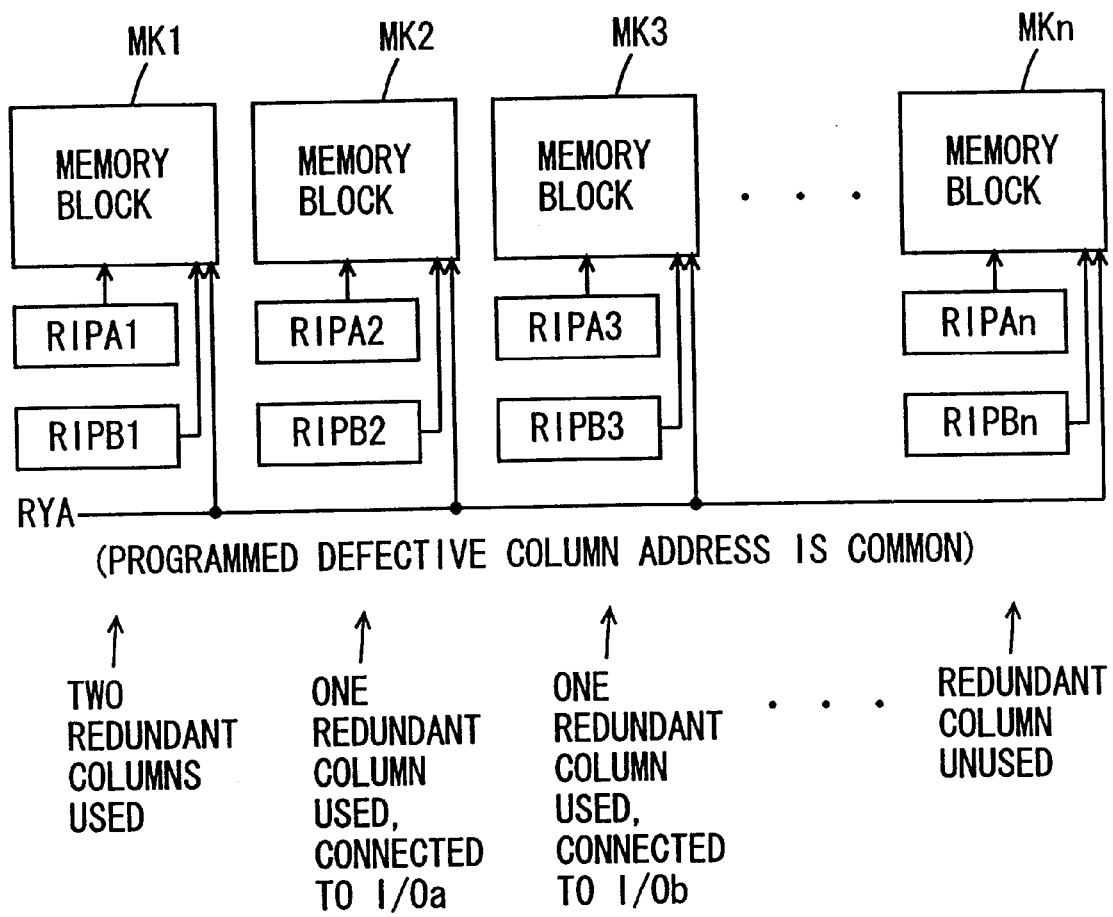
F I G. 1 4

FOR A PREDETERMINED
NUMBER OF MEMORY BLOCKS

FOR A
PREDETERMINED
NUMBER OF MEMORY
BLOCKS

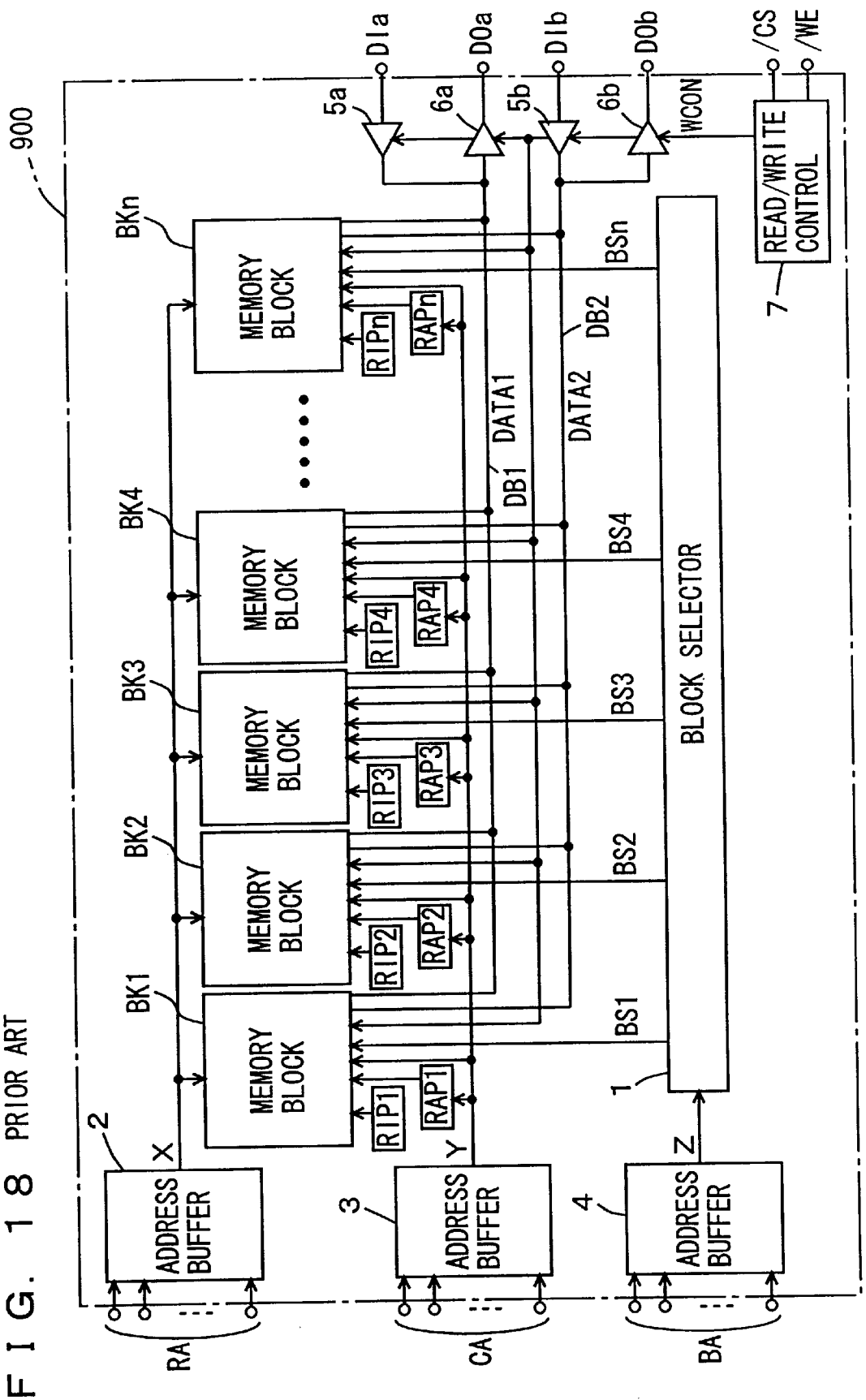
F I G. 1 8  PRIOR ART

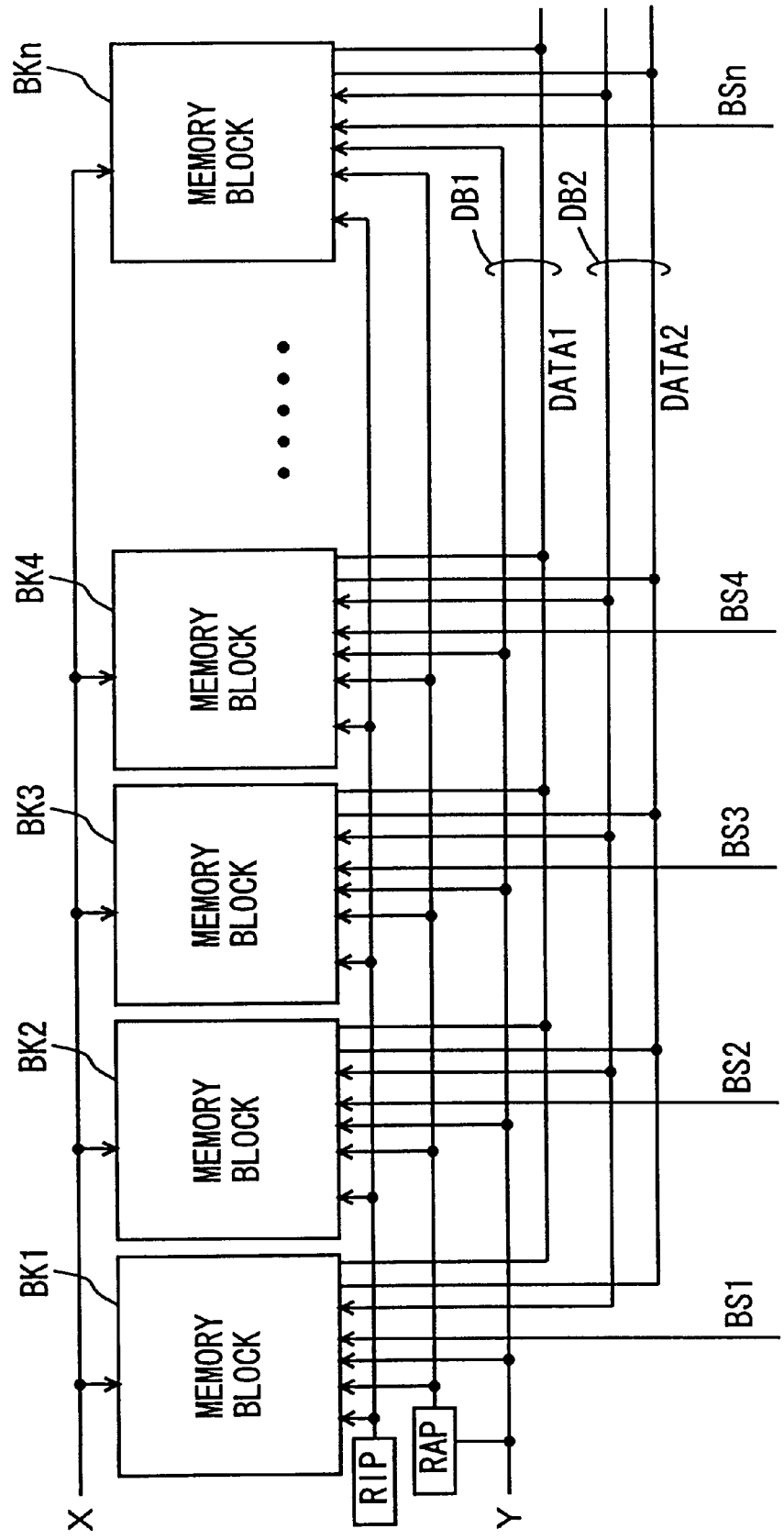
F I G. 2 5 PRIOR ART

SEMICONDUCTOR MEMORY DEVICE ALLOWING RELIABLE REPAIRING OF A DEFECTIVE COLUMN

BACKGROUND OF THE INVENTION

1. Field of the Invention

The invention relates to a semiconductor memory device, and particularly to a semiconductor memory device including a redundant column for repairing a defective memory cell column by replacement. More particularly, the invention relates to repairing of a defective column in the semiconductor memory device which has a plurality of memory blocks each having a redundant column and performs input/output of multi-bit data.

2. Description of the Background Art

Conventional semiconductor memory devices such as a static random access memory and a dynamic random access memory, which will be referred to as an "SRAM" and a "DRAM" hereinafter, respectively, includes redundant circuits for improving a product yield. If a defect is present in a memory portion (memory cell array) of a produced semiconductor memory device, this defective memory portion is repaired by the function of the redundant circuit. This redundant circuit usually includes a redundant row for repairing a row containing a defective memory cell in the memory cell array as well as a redundant column for repairing a column containing a defective memory cell. The defective row or column is replaced with a redundant row or column so that the defective memory cell is equivalently repaired.

FIG. 18 schematically shows a whole structure of a conventional SRAM. In FIG. 18, an SRAM 900 includes a plurality of memory blocks BK1–BKn each including a plurality of static memory cells arranged in rows and columns as well as a redundant column, and a block selector 1 for decoding a block address signal Z applied through an address buffer 4 to produce block select signals BS1–BSn for selecting one of memory blocks BK1–BKn. When the SRAM has a memory capacity of 4 Mbits, 64 memory blocks BK1–BK64 are included, and each memory block BK has a memory capacity of 64 Kbits. Data access (data write/read) is performed on a memory cell block selected by block selector 1.

SRAM 900 further includes an address buffer 2 to receive an externally applied row address signal RA for producing an internal row address signal X, an address buffer 3 to receive an externally applied column address signal for producing an internal column address signal Y, an address buffer 4 to receive an externally applied block address signal BA for producing an internal block address signal Z, input buffers 5a and 5b to receive input data DIa and DIb for producing internal write data on internal data line pairs DB1 and DB2, respectively, output buffers 6a and 6b to buffer internal read data DATA1 and DATA2 on internal data line pairs DB1 and DB2 for producing external read data DOa and DOb, respectively, and a read/write control circuit 7 responsive to an externally applied chip select signal /CS and an externally applied write enable signal /WE for producing an operation control signal WCON for buffers 5a, 5b, 6a and 6b to control write/read operations for a selected memory block.

SRAM 900 operates statically, and address buffers 2, 3 and 4 produce internal address signals X, Y and Z from address signals RA, CA and BA supplied thereto, respectively. When chip select signal /CS attains the active state at L-level, SRAM 900 is set to the selected state, and data access is performed. Writing or reading of data is executed depending on whether write enable signal /WE is at H-level or L-level.

Internal data line pairs DB1 and DB2 are provided commonly to memory blocks BK1–BKn, and access to data of 2 bits is performed on the selected memory block.

Each of memory blocks BK1–BKn includes one redundant column. For designating which of internal data line pairs DB1 and DB2 is to be connected to a redundant column, replacement IO program circuits RIP1–RIPn are provided for memory blocks BK1–BKn, respectively. Further, memory blocks BK1–BKn are provided with replacement column address program circuits RAP1–RAPn each for storing a defective column address designating a defective column to be repaired, respectively.

When block selector 1 generates a block select signal BSi (i=1–n) selecting a memory block BKi, a corresponding redundant column is selected in memory block BKi, and the redundant column is connected to one of internal data line pairs DB1 and DB2 in accordance with the information stored in replacement IO program circuit RIPi. Thus, a defective column in each memory block BK can be repaired independently of the other memory blocks.

FIG. 19 schematically shows a structure of memory blocks BK1–BKn shown in FIG. 18. Memory blocks BK1–BKn have the same structure, and FIG. 19 shows memory block BK1 as a representative.

In FIG. 19, memory block BK1 includes memory sub-blocks 910a and 910b provided corresponding to internal data line pairs DB1 and DB2, respectively, and a redundant column block 930 provided commonly to memory sub-blocks 910a and 910b. A row decoder 920 is provided commonly to memory sub-blocks 910a and 910b as well as redundant column block 930. Row decoder 920 is activated in response to activation of block select signal BS1 received from block selector 1 shown in FIG. 18, to decode internal row address signal X received from address buffer 2 shown in FIG. 18 and drive addressed rows in memory sub-blocks 910 and 910b as well as redundant column block 930 to the selected state.

Memory sub-block 910a includes a memory cell array 911a having a plurality of static memory cells arranged in rows and columns, bit line load circuits 912a arranged corresponding to the respective columns (bit line pairs) in memory cell array 911a for supplying a column current to corresponding bit line pairs, a column decoder 913a to decode an internal column address signal T received from address buffer 3 shown in FIG. 18 for producing a column select signal, multiplexers 914a provided corresponding to the respective columns in memory cell array 911a for connecting a selected column in memory cell array 911a to internal IO line pair I/Oa in accordance with the column select signal from column decoder 913a, a sense amplifier 916a selectively activated in response to write control signal WCON from read/write control circuit 7 and block select signal BS1, to amplify the internal read data on internal IO line pair I/Oa for transmission onto internal data line pair DB1, and a write buffer 915a selectively activated in response to block select signal BS1 and write control signal WCON, to amplify the data on internal data line pair DB1 for transmission onto internal IO line pair I/Oa.

Sense amplifier 916a and write buffer 915a are selectively activated in accordance with write control signal WCON when block select signal BS1 is active. When block select signal BS1 is inactive, sense amplifier 916a and write buffer 915 are set to an output high impedance state. Column decoder 913a executes the column selection in accordance with internal column address signal Y applied thereto.

Memory sub-block 910b has a structure similar to that of memory sub-block 910a, and includes a memory cell array 911b, a bit line load circuit 912b, a column decoder 913b, a multiplexer 914b, a sense amplifier 916b and a write buffer 915b. Sense amplifier 916b and write buffer 915b couple internal data line pair DB to internal IO line pair I/Ob when made active.

Redundant column block 930 has a redundant column 931 having the same rows as memory cell arrays 911a and 911b, a redundant column decoder 933 to generate a redundant column select signal in accordance with output signals of replacement column address program circuit RAP1 and replacement IO program circuit RIP1 while inhibiting the column selecting operation of column decoders 913a and 913b, a multiplexer (MUX) 934 to connect redundant column 931 to one of internal IO line pairs I/Oa and I/Ob in accordance with the select signal of redundant column decoder 933, and a bit line load circuit 932 to supply a column current to redundant column 931.

Replacement column address program circuit RAP1 receives internal column address signal Y and a stored defective column address, and activates redundant column decoder 933 when the internal column address signal designates a defective column address. When activated, redundant column decoder 933 produces the select signal for connecting redundant column 931 to the internal IO line pair corresponding to the internal data line pair designated by replacement IO program circuit RIP1.

Multiplexer 934 includes select gates for connecting redundant column 931 to internal IO line pairs I/Oa and I/Ob, respectively, and connects redundant column 931 to one of internal IO line pair I/Oa or I/Ob in accordance with the select signal received from redundant column decoder 933.

Memory cells in one column are connected to redundant column 931, so that a defective column in one of memory cell arrays 911a and 911b can be repaired by replacement in memory block BK1.

FIG. 20 schematically shows a structure of the memory sub-block. The memory sub-blocks included in memory blocks BK1–BKn have the same structure, and FIG. 20 shows a structure of memory sub-block 910a shown in FIG. 19.

In FIG. 20, memory cell array 911a includes a plurality of memory cells arranged in rows and columns. As a representative, FIG. 20 shows static memory cells 940a–940b arranged in two rows and two columns. Word lines L are arranged corresponding to the rows of memory cells, respectively, and bit line pairs BLP are arranged corresponding to the columns of memory cells, respectively. FIG. 20 shows two word lines WL0 and WL1 as well as two bit line pairs BLP0–BLP1 as a representative.

Word lines WL0 and WL1 are driven to the selected state in accordance with the row select signal applied from row decoder 920. Bit line pair BLP0 includes bit lines 941a and 941b transmitting complementary data signals, and bit line pair BLP1 includes bit lines 942a and 942b transmitting complementary data signals.

Bit line load circuit 912a includes N-channel MOS transistors 943a, 943b, 944a and 944b provided corresponding to bit lines 941a, 941b, 942a and 942b, respectively and operating in a diode mode. Each of MOS transistors 943a, 943b, 944a and 944b included in bit line load circuit 912a receives an array power supply voltage on its gate and a drain to precharge a corresponding bit line pair to a voltage level lower by its threshold voltage than the array power supply voltage. Further, each of the transistors 943a, 943b, 944a and 944b functions as a pull-up element in a data read operation, and supplies a current to the corresponding bit lines for causing a potential difference corresponding to the stored data of memory cell between the bit lines.

Internal IO line pair I/Oa includes internal IO lines 929a and 929b transmitting complementary data signals. These internal IO lines 929a and 929b are coupled to sense amplifier 916a and write buffer 915a.

Multiplexer 914a includes transfer gates 945a and 945b provided corresponding to bit lines 941a and 941b and turned on to couple bit lines 941a and 941b to internal IO lines 929a and 929b in response to a column select signal YS1a from column decoder 913a and transfer gates 946a and 946b provided corresponding to bit lines 942a and 942b and turned on to couple bit lines 942a and 942b to internal IO lines 929a and 929b in response to a column select signal YS2a from column decoder 913a.

Row decoder 920 is active when block select signal BS1 is active, to decode internal row address signal X to drive word line WL (WL0, WL1, . . . ) corresponding to an addressed row to the selected state. Column decoder Y is inactive and is inhibited of the column select operation when a redundant column select signal RCSa applied from redundant column decoder 933 shown in FIG. 19 is active. When redundant column select signal RCSa is inactive, column decoder 913a performs the decoding in accordance with internal column address signal Y, and drives one of column select signals YS1a, YS2a, . . . to the selected state.

In the data read operation, sense amplifier circuit 916a is activated. In the data write operation, write buffer 915a is activated. Therefore, when memory block BK1 shown in FIG. 19 is selected, data access via a bit line pair selected by column decoder 913a is performed if a defective column is not addressed and the data access to a selected memory cell is performed via output buffer 6a or input buffer 5a shown in FIG. 18. When the defective column of memory cell array 911a is addressed, redundant column select signal RCSa is activated, and column decoder 913a maintains the inactive state. A selected memory cell on redundant column 931 shown in FIG. 19 is coupled to internal IO line pair I/Oa (row decoder 920 selects a row even on the redundant column).

FIG. 21 shows a structure of the memory cell. The memory cell is a static memory cell. The normal memory cell and the redundant memory cell have the same structure. FIG. 20 shows, as a representative, the structure of memory cell 940a shown in FIG. 20. In FIG. 20, memory cell 940a includes an N-channel MOS transistor 948a turned on to couple bit line 941a to a storage node SNa in response to a signal potential on word line WL0, an N-channel MOS transistor 948b turned on to couple bit line 941a to a storage node SNa in response to a signal potential on word line WL0, an N-channel MOS transistor 947a connected between storage node SNa and the ground node and having a gate connected to storage node SNb, an N-channel MOS transistor 947b connected between storage node SNb and the ground node and having a gate connected to storage node SNa, a resistance element 949a of a high resistance connected between a power supply node and storage node SNa, and a resistance element 949b of a high resistance connected between the power supply node and the storage node SNb.

When memory cell 940a is selected, the signal potential on word line WL0 rises to H-level, and MOS transistors 948a and 948b are turned on to connect storage nodes SNa and SNb to bit lines 941a and 941b, respectively. The potentials on storage nodes SNa and SNb are latched by MOS transistors 947a and 947b. Bit lines 941a and 941b are supplied with currents from the bit line load circuit (MOS transistors 943a and 943b). The potentials on bit lines 941a and 941b depend on the currents supplied from corresponding bit line load transistors 943a and 943b, the channel resistances of accessing MOS transistors 948a and 948b, and the resistance values of MOS transistors 947a and 947b for storage. When data at H-level is held on storage node SNa, MOS transistor 947b is on, and MOS transistor 947a is off so that a current hardly flows from bit line 941a to storage node SNa. Meanwhile, a current flows from bit line 941b to the ground node via MOS transistors 948b and 947b, so that the potential on bit line 941b lowers. Thus, a potential difference occurs between bit lines 941a and 941b, and is amplified by the sense amplifier so that internal read data DATA1 is produced. In the write operation, bit lines 941a and 941b are set to the levels corresponding to the write data owing to the large current drive power of write buffer 915a, and the write data is transmitted to storage nodes SNa and SNb.

FIG. 22 shows another structure of the static memory cell. In this structure of the memory cell shown in FIG. 22, resistance elements 949a and 949b of a high resistance are replaced with P-channel MOS transistors 950a and 950b having gates connected to storage nodes SNb and SNa, respectively. Structures other than the above are the same as those shown in FIG. 21, and the corresponding portions bear the same reference numerals, respectively.

In the memory cell structure shown in FIG. 22, the memory cell is formed of an inverter latch so that a through-current of the memory cell during standby is reduced. For example, when storage node SNa is at H-level, MOS transistor 950b is off and cuts off the through-currents through the path of MOS transistors 950b and 947b. Further, storage node SNb is at L-level, and MOS transistor 947a is off to cut off the through-currents through the path of MOS transistors 950a and 947a. In the memory cell structure shown in FIG. 22, writing and reading of the data is performed similarly to those of the memory cell shown in FIG. 21.

FIG. 23 is a timing chart showing changes in internal signals during data reading of a memory cell. In FIG. 23, the abscissa gives time, and the ordinate gives the voltage (volt). "ADi" indicates changes in input signal of row address buffer 2, column address buffer 3 and block address buffer 4. "ADo" indicates changes in output signal of row address buffer 2, column address buffer 3 and block address buffer 4. "WL0" indicates changes in potential on word line WL0 connected to memory cell 940a. "I/O" indicates changes in potential on internal IO line pairs 929a and 929b. "SA0" indicates changes in output voltage of sense amplifier 916a. "Do" indicates changes in output voltage of data output buffer 6a. Operations for data reading of the conventional semiconductor memory device shown in FIGS. 18 to 22 will now be briefly described with reference to a timing chart of FIG. 23.

At time t0, externally applied address signal ADi (row address signal RA, column address signal CA and block address signal BA) changes, and address buffers 2, 3 and 4 buffer the applied address signals so that internal address signal ADo changes at time t1. Address buffers 2, 3 and 4, of which operation power supply voltage is, e.g., 5 V, convert the voltage level of externally applied address signal ADi of an amplitude of 3 V, to produce internal address signal ADo at the CMOS level.

Row decoder 920 is activated in response to block select signal BS1, to decode internal row address signal X received from row address buffer 2, for driving word line WL0 corresponding to the addressed row to the selected state at time t2. When the voltage level on word line WL0 rises, MOS transistors 948a and 948b shown in FIGS. 21 and 22 are turned on to couple storage nodes SNa and SNb to bit lines 941a and 941b, respectively. In accordance with the stored data on storage nodes SNa and SNb, the column currents flow through bit lines 941a and 941b, and the potential difference occurs between bit lines 941a and 941b. Column decoder 913a (or 913b) performs the column selection to drive column select signal YS1a to the selected state at H-level so that transfer gates 945a and 945b shown in FIG. 20 are turned on. Thereby, bit lines 941a and 941b are coupled to internal IO lines 929a and 929b, and the potentials on internal IO line pair I/Oa change in accordance with the selected memory cell data.

At time t4, sense amplifier 916a is activated in accordance with the control signal WCON and block select signal BS1 applied from read/write control circuit 907. The activation timing of sense amplifier 916a (or 916b) depends on an address transition detection signal of an ATD circuit (now shown). As a result of the sense operation of sense amplifier 916a, the output data signal of sense amplifier 916a changes at time t4.

Read data DATA1 of sense amplifier 916a is transmitted to output buffer 6a shown in FIG. 18 via internal data line pair DB1. Under the control of read/write control circuit 7, data output buffer 6a is activated to amplify the data on internal data line pair DB1 to generate external read data DOa (Do) at time t5. At time t5, external read data corresponding to the selected memory cell data is output.

The description has been given on the data read operation for memory cell 940a in memory cell array 911a of memory sub-block 910a. However, memory cell select operations similar to the above are performed in the other sub-block 910b of memory block BK1, and data of a selected memory cell is read onto internal data line pair DB2. Therefore, data of 2 bits are simultaneously output. The foregoing operations are performed when selected memory cells are present on normal columns other than a defective column.

When a selected memory cell is present on a defective column, access to this defective column is not performed, and access to the redundant column is performed. A defective memory cell column address indicating the position of a defective memory cell column is programmed by selectively blowing off a link element(s) (not shown) arranged in replacement column address program circuit RAP1. The replacement internal data line pair is programmed by selectively blowing off a link element(s) arranged in replacement IO program circuit RIP1. Accordingly, when an access to the column containing a defective memory cell is requested, multiplexer 934 selectively connects redundant column 931 to one of internal IO line pairs I/Oa and I/Ob in accordance with the output of redundant column decoder 933, which in turn is shown in FIG. 19 and operates in accordance with the output signals of replacement column address program circuit RAP1 and replacement IO program circuit RIP1.

When a defective column is present in memory cell array 911a and is to be repaired by replacement with redundant column 931, internal data line pair DB1 is programmed in replacement IO program circuit RIP1, and the redundant column is connected to internal IO line pair I/Oa. At this time, column decoder 913a is maintained inactive, and data on redundant column 931a is read onto internal IO line pair I/Oa. Further, the data of a selected memory cell in memory cell array 911*b* is read onto internal IO line pair I/Ob. Even in this case, reading of data of 2 bits is likewise performed.

FIG. 24 schematically shows a structure of a peripheral circuit of the redundant column shown in FIG. 19. In FIG. 24, redundant column 931 includes redundant memory cells 980*a* and 980*c* arranged in a single column. Each of redundant memory cells 980*a* and 980*c* has the structure shown in FIG. 21 or 22. Word lines WL0 and WL1 are arranged for redundant memory cells 980*a* and 980*c,* respectively. Memory cells 980*a* and 980*c* are connected to bit lines 981*a* and 981*b*. Bit line load circuit 932 includes MOS transistors 983*a* and 983*b* provided corresponding to bit lines 981*a* and 981*b,* respectively. Each of MOS transistors 983*a* and 983*b* has a gate connected to the power supply node, and operates in the diode mode.

Multiplexer 934 includes transfer gates 985*a* and 985*b* turned on to connect bit lines 981*a* and 981*b* to internal IO lines 929*a* and 929*b,* respectively, when a redundant column select signal RCSa applied from redundant column decoder 933 is activated, and transfer gates 986*a* and 986*b* turned on to couple bit lines 981*a* and 981*b* to internal IO lines 989*a* and 989*b,* respectively, when a redundant column select signal RCSb applied from redundant column decoder 933 is activated.

Redundant column decoder 933 drives one of redundant column select signals RCSa and RCSb to the selected state in accordance with replacement IO select signals RISa and RISb received from the replacement IO program circuit as well as a redundant column access instructing signal RYA received from the replacement column address program circuit. When one of redundant column select signals RCSa and RCSb is driven to the selected state, column decoders 913*a* and 913*b* shown in FIG. 19 are kept inactive.

The replacement column address program circuit stores a defective column address with a fuse programming, and drives a defective column replacement instructing signal RYA to the active state when an applied internal column address signal matches with the programmed defective column address. Redundant column decoder 933 drives one of redundant column select signals RCSa and RCSb to the selected state in accordance with replacement IO instructing signals RISa and RISb when redundant column access instructing signal RYA is activated. In the case where one redundant column is provided for two memory cell arrays, the redundant column can be connected to one of internal IO line pairs I/Oa and I/Ob depending on the memory cell array containing a defective column, and the repairing by replacement of the defective column can be performed.

The redundant column is provided in each of memory blocks BK1–BKn, and the replacement column address program circuit and the replacement IO program circuit are likewise provided for each of memory blocks BK1–BKn. Accordingly, repairing of a defective column in each memory block can be performed independently of the other memory blocks.

The replacement column address program circuit includes program circuits provided corresponding to respective bits Y<i> of the column address signal, respectively. These program circuits include fuse program circuits, and equivalently generates signals each indicating whether the programmed address bit matches with an applied column address signal bit. When all the output signals applied from the address program circuits provided corresponding to respective column address signal bits represent matching, redundant column access instructing signal RYA is driven to the active state. In the semiconductor memory device of a large storage capacity, therefore, the scale of the replacement column address program circuit increases as the bits of column address signal increase in number. In the case where the replacement column address program circuits are provided corresponding to memory blocks BK1–BKn, respectively, such a problem arises that the chip area increases. In particular, the fuse program circuit includes fuse elements, and occupies a large area. Therefore, the circuits for the redundant column programming occupy a large area, and the semiconductor memory device having a high integration density cannot be achieved.

In recent years, I/O bits of data of a semiconductor memory device have been increased, e.g., to 16 bits or 32 bits, and the number of internal data line pairs increases in accordance with this increase in number of the data bits. The replacement IO program circuit likewise includes fuse program circuits provided corresponding to the respective data bits. Further, these defective column address bits and the internal data line pairs (IO) must be programmed for each of memory blocks, and the programming is performed by blowing the link element(s) (fuse element(s)). For these reasons, the time required for programming for the defective column repairing increases, and the production efficiency lowers.

For overcoming the above problems, a structure shown in FIG. 25 has been proposed. In FIG. 25, replacement column address program circuit RAP and replacement IO program circuit RIP are provided commonly to memory blocks BK1–BKn. Structures other than the above are the same as those shown in FIG. 18. The structure shown in FIG. 25 uses only one replacement column address program circuit RAP and only one replacement IO program circuit RIP, and can reduce the area occupied by the circuits provided for repairing a defective column address. Further, the programming of the defective column address and the replacement IO is performed for only one circuit, and the programming of defective column address for each of memory blocks BK1–BKn is not required so that the time required for programming for the defective column repairing can be reduced, and the production efficiency can be improved.

In the structure shown in FIG. 25, however, only the same column address is repaired in memory blocks BK1–BKn by each respective redundant column. Therefore, defective columns can be repaired with corresponding redundant columns in all memory blocks BK1–BKn if defective columns are present at the same column address in respective memory blocks BK1–BKn. However, programming of the defective column address cannot be performed for the respective memory blocks BK1–BKn. This significantly reduces the flexibility in programming of a defective column address and the defective column repairing efficiency. Although the redundant column is provided in each of memory blocks BK1–BKn, the above structure is equivalent to the structure in which a single redundant column is provided commonly for memory blocks BK1–BKn, resulting in a low efficiency of use of the redundant columns. The replacement with a redundant column is likewise performed even in a memory block containing no defective column, and thus unnecessary replacement of the redundant column is performed.

The structure for repairing a redundant column is not restricted to the SRAM, and may be employed in other memories such as DRAMs and flash memories. These DRAMs and flash memories suffer from similar problems when input/output of multi-bit data is performed and a redundant column is to be repaired independently in each block.

SUMMARY OF THE INVENTION

An object of the invention is to provide a semiconductor memory device which can efficiently repair a defective column without increasing a chip area.

Another object of the invention is to provide a semiconductor memory device, in which an area occupied by a program circuit for repairing a defective column can be reduced while suppressing lowering of flexibility in programming of a defective column.

A semiconductor memory device according to the invention includes a plurality of data terminals; a plurality of internal data lines provided corresponding to the plurality of data terminals, respectively; a plurality of memory arrays each including memory cells arranged in rows and columns, and a redundant cell column for repairing a defective memory cell in at least one column; normal column select circuits provided corresponding to the plurality of memory arrays, respectively, for simultaneously selecting a plurality of memory cells from the corresponding memory arrays and coupling the selected memory cells to the plurality of internal data lines, respectively; a plurality of replacement IO program circuits provided corresponding to the plurality of memory arrays, respectively, for storing IO addresses specifying the internal data lines to be connected to the redundant cell columns in the corresponding memory arrays; a replacement column address program circuit provided commonly to a predetermined number of memory arrays among the plurality of memory arrays for storing defective column addresses indicating defective memory cell columns in the predetermined number of memory arrays; and redundant column select circuits provided corresponding to the plurality of memory arrays, respectively, and each coupled to a corresponding replacement IO program circuit and a corresponding replacement column address program circuit for selecting a redundant cell column in the corresponding memory array when an applied address indicates a defective memory cell column in the corresponding memory array.

Each replacement IO program circuit is provided corresponding to the memory arrays of a unit for independent repairing. Also, the replacement column address program circuit is provided for the predetermined number of memory arrays. Thereby, the flexibility in defective column programming is improved as compared with the structure in which a single replacement column address program circuit and a single replacement IO program circuit are provided commonly to all the memory arrays. Since the replacement IO program circuit is provided for each memory array, a defective column can be changed every IO on a memory block basis, so that the replacement efficiency is improved.

The replacement column address program circuit is provided for the predetermined number of memory arrays, and the replacement column address program circuits can be significantly reduced in number as compared with the structure with the replacement column address program circuits corresponding to the respective memory arrays. Therefore, an area occupied by the replacement column address program circuits can be small, and an area occupied by the program circuits for repairing a defective column address can be reduced. Accordingly, a chip area can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 schematically shows a state of use of a redundant column in the semiconductor memory device according to the sixth embodiment of the invention;

FIG. 18 schematically shows a whole structure of a conventional semiconductor memory device;

FIG. 25 schematically shows a structure of a conventional semiconductor memory device.

DESCRIPTION OF THE PREFERRED EMBODIMENTS

[First Embodiment]

Figure 1:
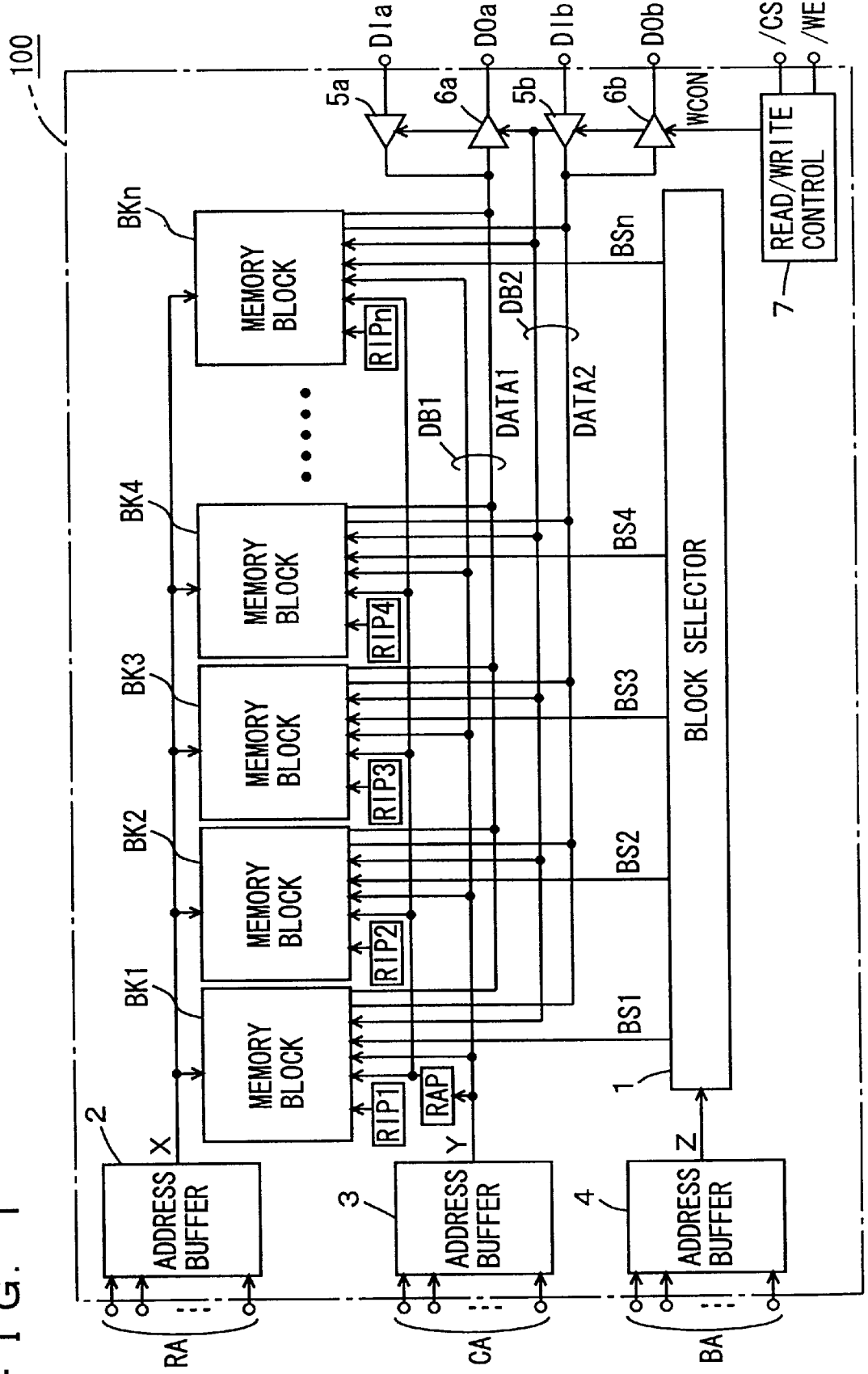
FIG. 1 schematically shows a whole structure of a semiconductor memory device according to a first embodiment of the invention.

FIG. 1 schematically shows a whole structure of a semiconductor memory device according to a first embodiment of the invention. In FIG. 1, a semiconductor memory circuit 100 includes memory blocks BK1–BKn each having a plurality of memory cells arranged in rows and columns, replacement IO program circuits RIP1–RIPn provided corresponding to memory blocks BK1–BKn and storing internal data lines (IO) corresponding to redundant columns provided in the corresponding memory blocks, respectively, and a replacement column address program circuit RAP provided commonly to memory blocks BK1–BKn for storing a defective column address.

FIG. 1 shows, by way of example, a structure of semiconductor memory device 100 for performing input/output of data of 2 bits. More specifically, the structure shown in FIG. 1 includes input buffers 5a and 5b corresponding to input data DIa and DIb, respectively, and output buffers 6a and 6b corresponding to output data DOa and DOb, respectively. Input buffer 5a and output buffer 6a are connected to an internal data line pair DB1, and input buffer 5b and output buffer 6b are connected to an internal data line pair DB2.

Each of memory blocks BK1–BKn includes memory sub-blocks provided corresponding to respective internal data line pairs DB1 and DB2, similarly to the conventional structure.

Similarly to the conventional structure, semiconductor memory device 100 further includes an address buffer 2 receiving an externally applied row address signal RA, to produce an internal row address signal X, an address buffer 3 receiving an externally applied column address signal CA to produce an internal column address signal Y, an address buffer 4 receiving an externally applied block address signal BA to produce an internal block address signal Z, a block selector 1 decoding internal block address signal Z received from address buffer to drive one of block select signals BS1–BSn to the active state, and a read/write control circuit 7 producing a write control signal WCON in accordance with a chip select signal /CS and a write enable signal /WE.

Replacement column address program circuit RAP is provided commonly to memory blocks BK1–BKn, whereby an area occupied by the replacement column address program circuit is reduced.

Further, replacement IO program circuits RIP1–RIPn are provided corresponding to memory blocks BK1–BKn, respectively, whereby use/nonuse of the redundant column in each memory block can be programmed independently of the other memory blocks. By programming a redundant column non-use state (not blowing a fuse) in replacement IO program circuits RIP1–RIPn, replacement of a redundant column is inhibited in the normal memory block. In contrast to the structure in which the replacement IO program circuit is provided commonly to memory blocks BK1–BKn, use/non-use of the redundant column and the connecting IO in each memory block can be programmed independently of the other blocks so that the flexibility in programming of a defective column address is improved. The inner structure of the memory block is the same as that shown in FIGS. 18–24.

Figure 2:
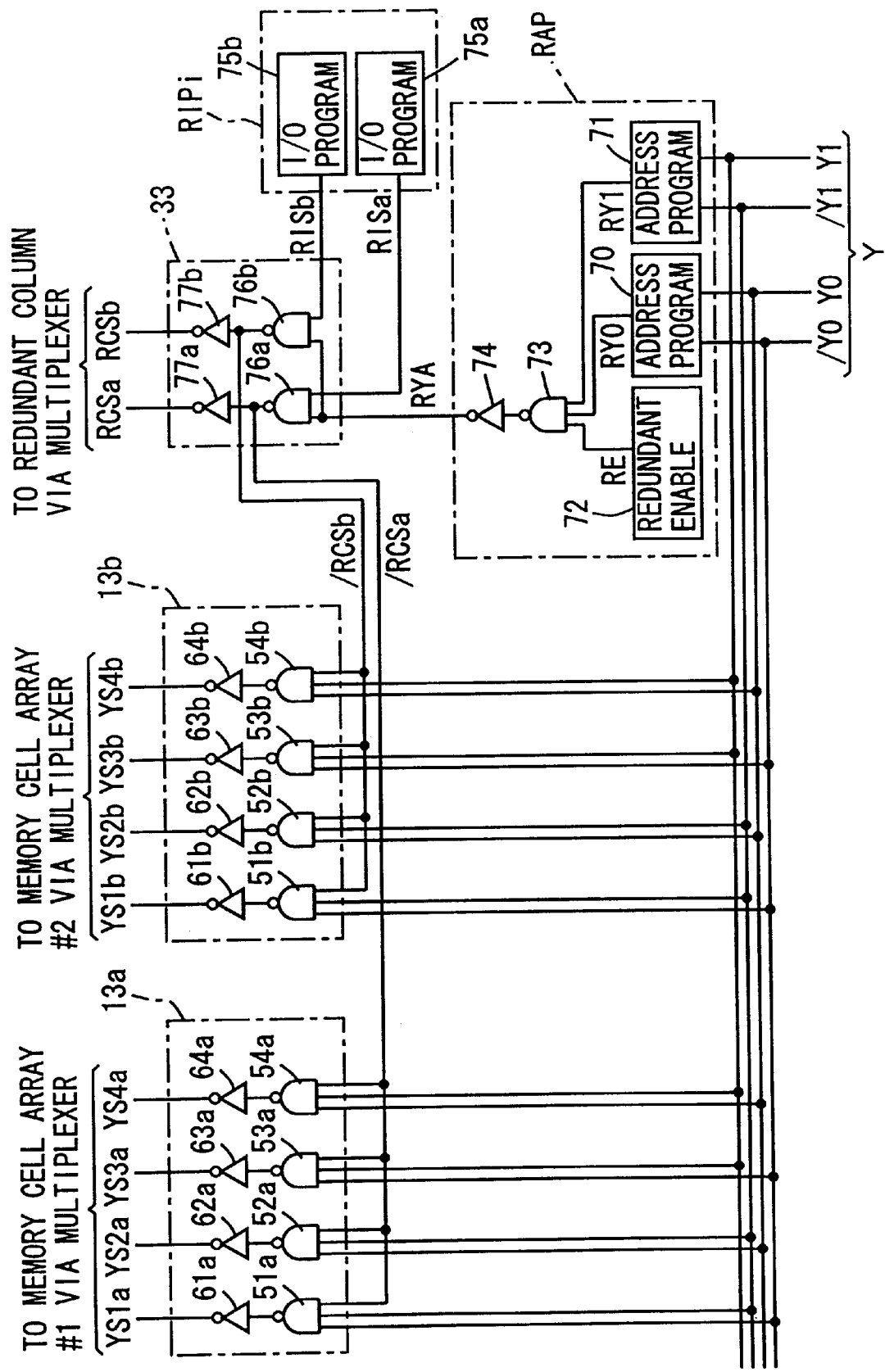
FIG. 2 schematically shows a structure of a column-related select circuit in a memory block of a semiconductor memory device shown in FIG. 1.

FIG. 2 schematically shows a column-related structure in one memory block. In FIG. 2, the memory block includes memory cell arrays #1 and #2 provided corresponding to internal data line pairs DB1 and DB2, respectively. For these memory cell arrays #1 and #2, there are arranged column decoders 13a and 13b, respectively. Also, a single redundant column is arranged commonly to memory cell arrays #1 and #2. FIG. 2 shows a structure for such a case that each of memory cell arrays #1 and #2 includes four columns of the memory cells, and one redundant column is provided commonly to these memory cell arrays #1 and #2.

In each of memory cell arrays #1 and #2, one memory cell column is selected from four columns. Therefore, column address signal Y includes complementary address bits Y0 and /Y0, and Y1 and /Y1 of 4 bits.

Defective column address program circuit RAP provided commonly to memory blocks BK1–BKn includes an address program circuit 70 provided for column address bits Y0 and /Y0, an address program circuit 71 provided for column address bits Y1 and /Y1, a redundant enable circuit 72 storing information indicating whether a redundant column is to be used or not, an NAND circuit 73 receiving redundant enable signal RE from redundant enable circuit 72 and output signals RY0 and RY1 of address program circuits 70 and 71, and an inverter 74 inverting an output signal of NAND circuit 73 to generate a redundant column access instructing signal RYA.

Address program circuits 70 and 71, of which structures will be described later in greater detail, store the respective column address bits of a defective column address, and each pass one of the corresponding complementary address bits therethrough. NAND circuit 73 and inverter circuit 74 form an AND circuit. When redundant enable signal RE applied from redundant enable circuit 72 and output signals RY0 and RY1 of address program circuits 70 and 71 are all at H-level, redundant column access instructing signal RYA is driven to the active state. Thus, replacement column address program circuit RAP stores a defective column address for each bit, and drives redundant column access instructing signal RYA to the active state when the column address applied thereto matches with the defective column address.

Replacement IO program circuit RIPi provided for each memory block includes I/O program circuits 75a and 75b provided corresponding to internal data line pairs DB1 and DB2, respectively. When the redundant column is used, the internal data line pair (internal IO line pair) connected to this redundant column is programmed in I/O program circuits 75a and 75b. For example, if internal data line pair DB1 is to be coupled to the redundant column, and thus a defective column in memory cell array #1 is to be replaced with the redundant column, I/O program circuit 75a is programmed to set an output signal RISa to H-level. In I/O program circuit 75b, non-use is programmed (the fuse element is not blown) to fix an output signal RISb to L-level.

Column decoder 33 for the redundant column includes an NAND circuit 76a receiving redundant column access instructing signal RYA applied from replacement column address program circuit RAP and output signal RISa of I/O program circuit 75a, an NAND circuit 76b receiving redundant column access instructing signal RYA and output signal RISb of I/O program circuit 75b, an inverter circuit 77a inverting an output signal of NAND circuit 76a to produce redundant column select signal RCSa, and an inverter circuit 77b inverting an output signal of NAND circuit 76b to generate redundant column select signal RCSb.

Figure 24:
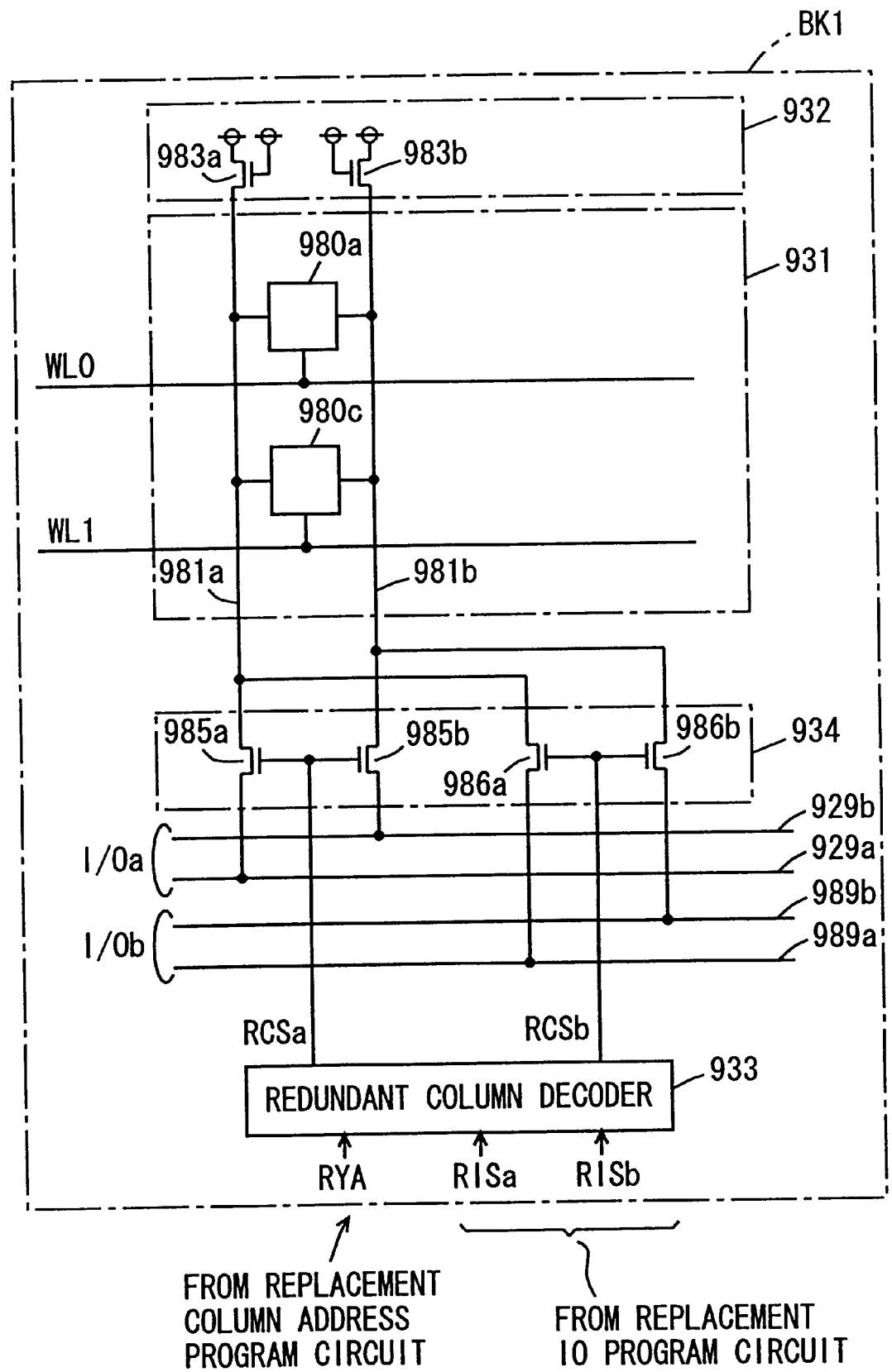
FIG. 24 shows a structure of a redundant column block shown in FIG. 19.

Redundant column select signals RCSa and RCSb from inverter circuits 77a and 77b are applied to multiplexer 934 for redundant column shown in FIG. 24, and the redundant column is connected to one of internal IO line pairs I/Oa and I/Ob.

Column decoder 13a includes NAND circuits 51a, 52a, 53a and 54a each receiving one of column address bits Y0 and /Y0 as well as one of column address bits Y1 and /Y1, and also includes inverter circuits 61a, 62a, 63a and 64a receiving the output signals of NAND circuits 51a, 52a, 53a and 54a to generate column select signals YS1a, YS2a, YS3a and YS4a, respectively. Each of NAND circuits 51a, 52a, 53a and 54a is also supplied with an inverted signal /RCSa of the redundant column select signal from redundant column decoder 33.

Similarly to column decoder 13a, column decoder 13b includes NAND circuits 51b, 52b, 53b and 54b each receiving one of column address bits Y0 and /Y0 as well as one of bits Y1 and /Y1, and also includes inverter circuits 61b, 62b, 63b and 64b receiving the output signals of NAND circuits 51b, 52b, 53b and 54b to generate column select signals YS1b, YS2b, YS3b and YS4b, respectively. Each of NAND circuits 51b, 52b, 53b and 54b is also supplied with an inverted signal /RCSb of the redundant column select signal from redundant column decoder 33.

When access to a normal memory cell column is performed, output signal RYA of replacement column address program circuit RAP is at L-level, and redundant column select signals RCSa and RCSb maintain L-level. Complementary redundant column select signals /RCSb and /RCSa are at H-level, and column decoders 13a and 13b are enabled. In this state, the column select operation is performed in each of column decoders 13a and 13b in accordance with the values of column address bits Y0, /Y0, Y1 and /Y1, and one of the column select signals is driven to the selected state. For example, when both column address bits Y0 and Y1 are "0", column select signals YS4a and YS4b are driven to the selected state at H-level so that corresponding memory cell columns are selected and coupled to internal IO line pairs I/Oa and I/Ob, respectively.

When a defective column is present, redundant enable circuit 72 is programmed in replacement column address program circuit RAP, and redundant enable signal RE is programmed to attain H-level. Also, the defective column address is programmed in address program circuits 70 and 71, respectively. In replacement IO program circuit RIPi, one of I/O program circuits 75a and 75b is programmed, and one of replacement IO select signals RISa and RISb is programmed to attain H-level.

In the defective column access operation, redundant column access instructing signal RYA from replacement column address program circuit RAP is driven to the selected state. It is now assumed that replacement IO select signal RISa is programmed to attain H-level. In this state, output signal /RCSa of NAND circuit 76a in column decoder 33 for the redundant column attains L-level, and redundant column select signal RCSa is driven to H-level. Redundant column select signal /RCSb maintains H-level, and redundant column select signal RCSb maintains L-level. Therefore, the redundant column is selected by redundant column select signal RCSa, and is coupled to internal IO line pair (I/Oa). Since complementary redundant column select signal /RCSa is at L-level, column decoder 13a is prohibited from performing the column decode operation so that all column select signals YS1a–YS4a maintain the non-selected state at L-level. Meanwhile, complementary redundant column select signal /RCSb is at H-level. Therefore, column decoder 13b performs the column selection in accordance with column address signal Y, and drive the column select signal corresponding to an addressed column to the selected state in accordance with column address signal Y. Accordingly, the selected column and redundant column are selected in memory cell array #2, and are connected in parallel to the internal IO line pairs of 2 bits.

Figure 3:
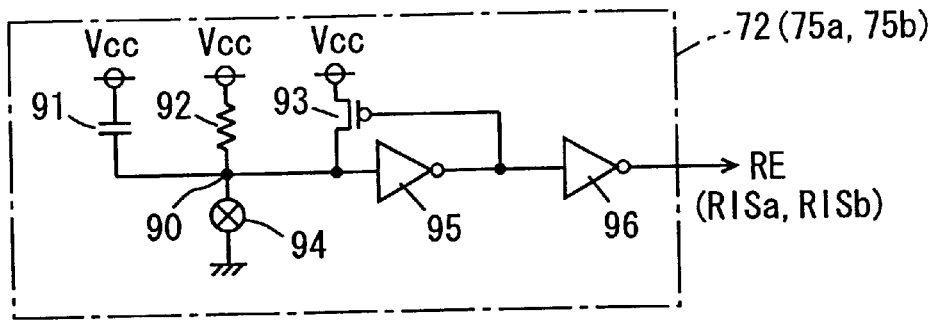
FIG. 3 shows an example of a structure of a redundant enable circuit shown FIG. 2.

FIG. 3 shows, by way of example, a structure of redundant enable circuit 72 included in replacement column address program circuit RAP shown in FIG. 2. In FIG. 3, redundant enable circuit 72 includes a capacitance element 91 connected between a power supply node and a node 90, a resistance element 92 of a high resistance connected between the power supply node and node 90, a fusible link element (fuse element) 94 connected between node 90 and the ground node, an inverter circuit 95 inverting a signal on node 90, an inverter circuit 96 inverting an output signal of inverter circuit 95 to produce a redundant enable signal RE, and a P-channel MOS transistor 93 turned on to pull up the node 90 to power supply voltage Vcc level when the output signal of inverter circuit 95 is at L-level.

For using the redundant column, fuse element 94 is blown. In this state, the voltage level on node 90 is raised by the capacitive coupling via capacitance element 91 after the power-on, and then the voltage level further rises owing to resistance element 92. When the voltage level on node 90 exceeds the input logical threshold voltage of inverter 95, the output signal of inverter 95 attains L-level, and redundant enable signal RE sent from inverter circuit 96 is driven to H-level. When the output signal of inverter circuit 95 attains L-level, P-channel MOS transistor 93 is turned on, and node 90 is rapidly pulled up to power supply voltage Vcc level.

If a defective memory cell column is not present in this semiconductor memory device, and the redundant column is not used, fuse element 94 is kept conductive. Even when power supply voltage Vcc level is supplied in the above state, fuse element 94 maintains node 90 at the ground voltage level, and the output signal of inverter circuit 95 is at H-level, so that redundant enable signal RE maintains L-level. Therefore, when redundant enable signal RE is at L-level, redundant column access instructing signal RYA shown in FIG. 2 is fixed to L-level, and selection of the redundant column is inhibited. When fuse element 94 is conductive, only a minute current flows through resistance element 92 of a high resistance. When the power is turned off in the state where fuse element 94 is blown, resistance element 92 of the high resistance reliably discharges the voltage level on node 90 to the ground voltage level via the power supply node after the voltage level on node 90 is lowered by capacitance element 91. Thereby, resistance element 92 prevents storage of negative residual charges on node 90.

Figure 4:
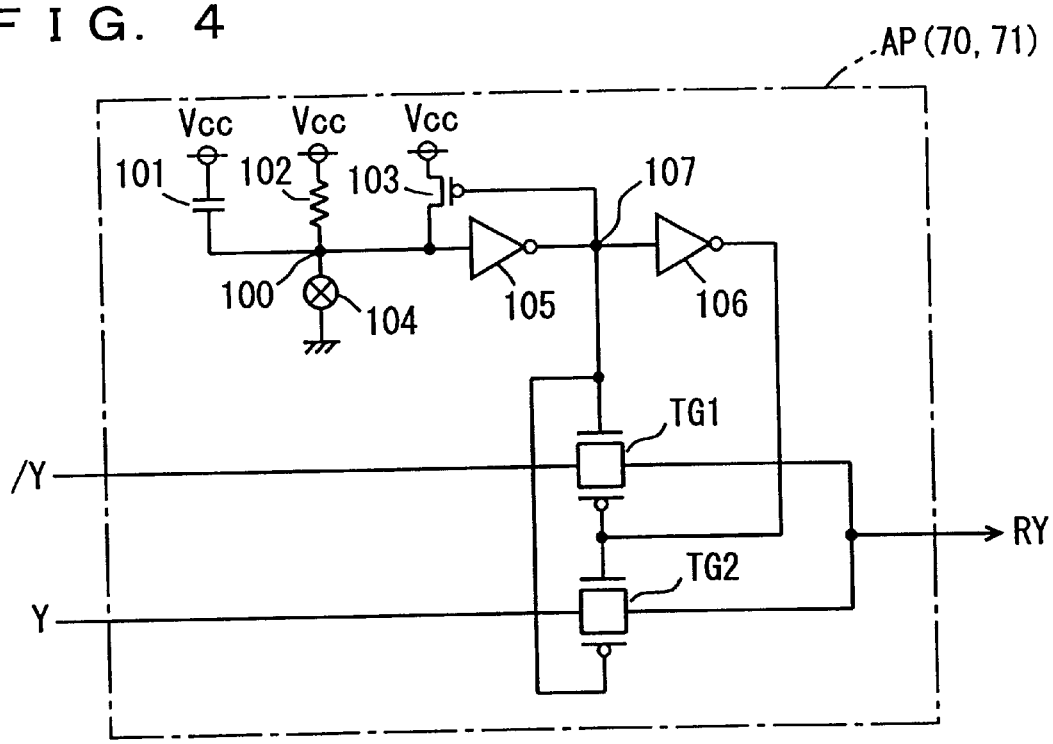
FIG. 4 shows, by way of example, a structure of an address program circuit shown in FIG. 2.

FIG. 4 shows a structure of one of address program circuits 70 and 71 included in replacement column address program circuit RAP shown in FIG. 2. Since address program circuits 70 and 71 have the same circuit structure, FIG. 4 shows the structure of only one of the address program circuits AP as a representative.

In FIG. 4, address program circuit AP includes a capacitance element 101 connected between a power supply node and a node 100, a resistance element 102 of a high resistance connected between the power supply node and node 100, a fuse element 104 connected between node 100 and the ground node, an inverter circuit 105 inverting a signal on node 100, an inverter circuit 106 inverting an output signal of inverter circuit 105, a P-channel MOS transistor 103 turned on to transmit power supply voltage Vcc to node 100 when the output signal of inverter circuit 105 is at L-level, a transmission gate TGl selectively turned on in accordance with the output signals of inverters 105 and 106, and passing complementary column address bit /Y therethrough when turned on, and a transmission gate TG2 turned on complementarily to transmission gate TG1 in response to the output signals of inverters 105 and 106, and passing column address bit Y therethrough when turned on. These transmission gates TG1 and TG2 generate column address bits RY for the redundant column.

When fuse element 104 is unblown, node 100 attains the ground voltage level, and the signal applied from inverter circuit 105 to output node 107 attains H-level. In this state, transmission gate TG1 is on, and transmission gate TG2 is off so that complementary column address bit /Y is generated as column address bit RY for the redundant column.

In the state where fuse element 104 is blown, node 100 attains H-level, and node 107 attains L-level so that transmission gate TG2 is on, and transmission gate TG1 is off. In this state where fuse element 104 is blown, column address bit Y is generated as column address bit RY for the redundant column. Depending on blown/unblown states of fuse element 104, one of column address bit Y and /Y is selected.

Column address bit RY for the redundant column generated from address program circuit AP is applied to NAND circuit 73 shown in FIG. 2. Therefore, when all the column address bits selected by address program circuits 70 and 71 attain H-level, redundant column access instructing signal RYA is driven to the selected state. Replacement column address program circuit RAP is subjected to programming of a defective column address every address bit. According to the result of this programming, NAND circuit 73 functioning as a decoder selectively activates redundant column access instructing signal RYA in accordance with whether applied column address signal Y designates a defective column address or not, and activates the column decoder for the redundant column 33. For example, when column address ((Y0, Y1)=(0, 1)) is the defective column address, fuse element 104 in address program circuit 70 is unblown, and fuse element 104 in address program circuit 71 is blown. In address program circuit 70, complementary column address bit /Y0 is selected. In address program circuit 71, column address bit Y1 is selected. Therefore, when defective column address ((Y0, Y1)=(0, 1)) is designated, both output signals RY0 and RY1 from respective address program circuits 70 and 71 attain H-level, and redundant column access instructing signal RYA is driven to the selected state at H-level.

When the column address signal Y is formed of (s+1) bits, address program circuits AP0–APs are provided corresponding to the sets of column address signal bits Y0 and /Y0, Y1 and /Y1, . . . , and Ys and /Ys, respectively. Output signals RY0–RYs of address program circuits AP0–APs are applied to NAND circuit 73 shown in FIG. 2, whereby it is determined whether the defective column is addressed or not (NAND circuit 73 and inverter 74 correspond to a decode circuit of the AND type).

Figure 5:
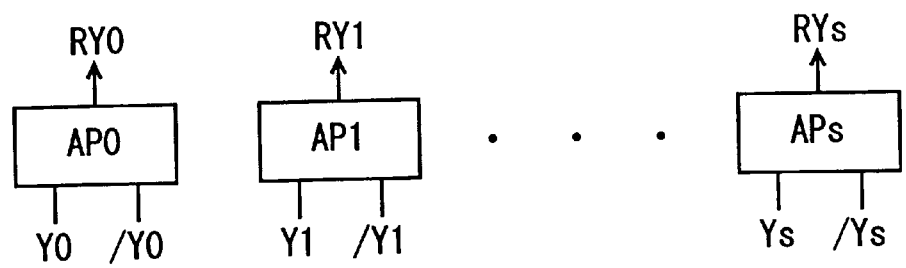
FIG. 5 schematically shows another structure of the replacement column address program circuit shown in FIG. 2.

As shown in FIG. 5, therefore, an area occupied by replacement column address program circuit RAP increases if the bit number of column address signal Y increases. By arranging replacement column address program circuit RAP commonly to memory blocks BK1–BKn, an area occupied by the replacement column address program circuit is reduced.

I/O program circuits 75a and 75b included in replacement IO program circuit RIPi have the same structure as redundant enable circuit 72 shown in FIG. 3. By blowing/non-blowing fuse element 94, programming is performed to specify the internal IO line pair connected to the redundant column.

Accordingly, use/non-use of the redundant column as well as the replacement IO can be programmed for each memory block. Compared with the structure in which the replacement IO program circuit is provided commonly to memory blocks BK1–BKn, the flexibility in programming of the redundant column is improved. The programming of a defective column address is required to be performed merely in replacement column address program circuit RAP, and therefore the fuse elements to be programmed can be reduced in number so that the time required for the defective column address programming can be reduced, resulting in improved productivity.

Figure 6:
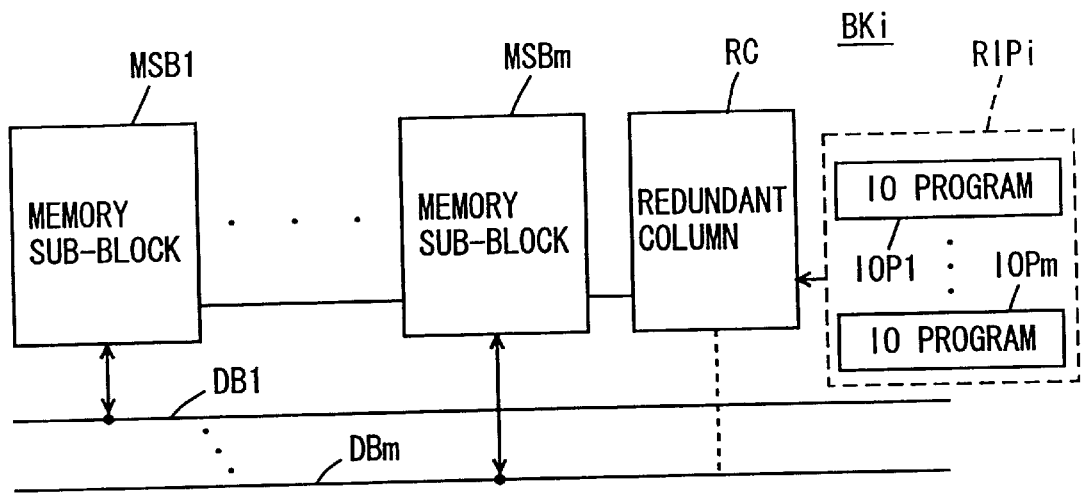
FIG. 6 schematically shows another structure of the memory block shown in FIG. 1.

FIG. 6 schematically shows a structure of one memory block in the case where data is formed of m bits. In FIG. 6, memory block BK1 includes memory sub-blocks MSB1–MSBm provided corresponding to internal data line pairs DB1–DBm, respectively, and a redundant column block RC provided commonly to memory sub-blocks MSB1–MSBm. Each of memory sub-blocks MSB1–MSBm includes an array of memory cells arranged in rows and columns, a bit line load circuit, sense amplifiers, a write buffer and a column decoder. Redundant column block RC likewise includes a column decoder, a bit line load circuit and a multiplexer.

For memory block BKi, there is arranged replacement IO program circuit RIPi. In replacement IO program circuit RIPi, IO program circuits IOP1–IOPm are arranged corresponding to internal data line pairs DB1–DBm, respectively. In accordance with the states of programming of IO program circuits IOP1–IOPm, the redundant column of redundant column block RC is selectively coupled to internal data line pairs DB1–DBm, or redundant column block RC is set to the un-used state. Actually, the redundant column of redundant column block RC is coupled to internal IO line pairs I/O1–I/Om arranged in memory sub-blocks MSB1–MSBm, but such a structure is not shown in the figure for simplicity reason.

As shown in FIG. 6, even if the number of data bits is large, the use/non-use of the redundant column and the replacement IO for each memory block can be programmed independently of the other memory blocks by merely increasing the number of IO program circuits in accordance with the number of data bits.

Figure 7:
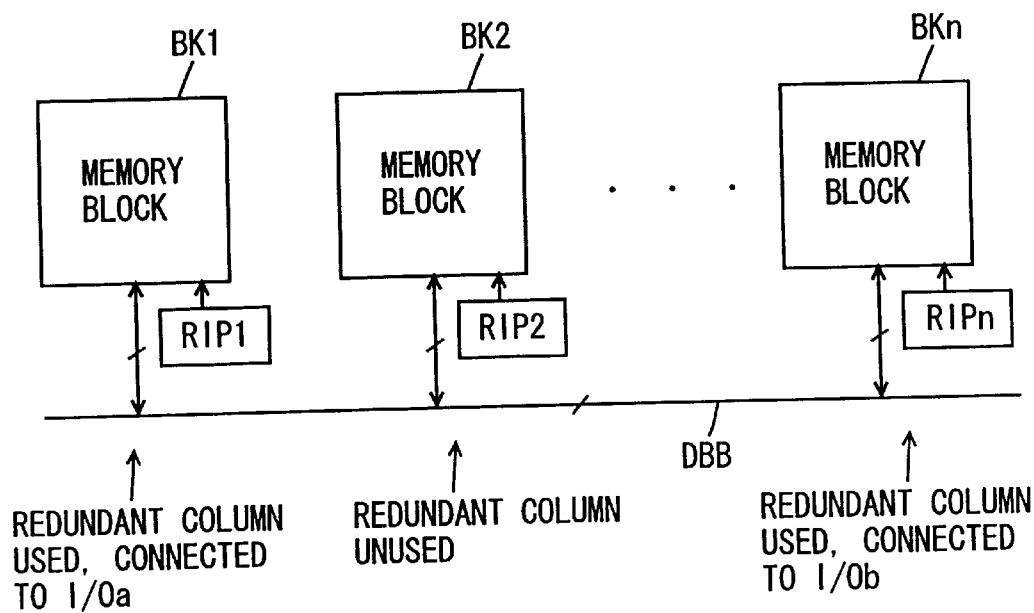
FIG. 7 schematically shows a state of use of a redundant column in the semiconductor memory device of the first embodiment of the invention.

FIG. 7 schematically shows a state of programming of the redundant column in the first embodiment of the invention. Replacement IO program circuits RIP1–RIPn are provided corresponding to memory blocks BK1–BKn, respectively. These replacement IO program circuits RIP1–RIPn can be programmed independently of each other. In FIG. 7, the redundant column is used for memory block BK1, and the state in which this redundant column is connected to internal IO line pair I/Oa is programmed. For memory block BK2, non-use of the redundant column is programmed. For memory block BKn, such a state is programmed that the redundant column is used and is connected to internal IO line pair I/Ob. Internal IO line pairs I/Oa and I/Ob are coupled to the corresponding internal data line pairs (DB1 and DB2) of internal data bus DBB. Accordingly, the flexibility in programming of the redundant column is higher than that of the structure in which the replacement of IO is programmed commonly to memory blocks BK1–BKn.

Although the internal structures of the memory block and memory sub-block are not described in detail, these internal structures are the same as those in the conventional semiconductor memory device already described with reference to FIGS. 19–25.

According to the first embodiment of the invention, as described above, the replacement column address program circuit is provided commonly to the plurality of memory blocks, and the replacement IO program circuits are provided corresponding to the memory blocks, respectively. Therefore, the area occupied by the redundant circuit provided for repairing a defective column address can be reduced. Since the replacement IO is programmed for each memory block independently of the other memory blocks, the efficiency of use of the redundant column can be increased, and the flexibility in programming of a defective column to be repaired can be improved.

[Second Embodiment]

Figure 8:
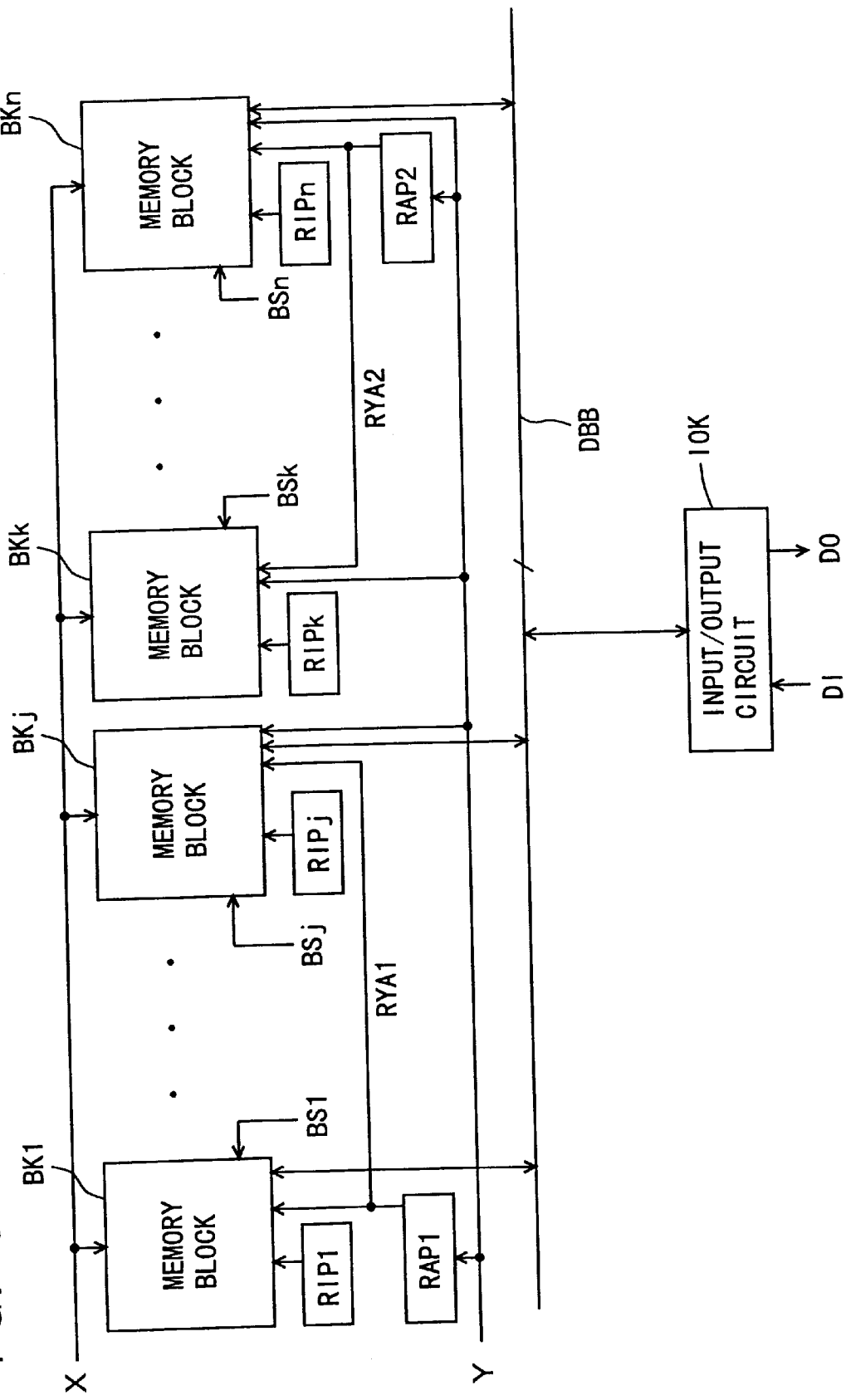
FIG. 8 schematically shows a structure of a main portion of a semiconductor memory device according to a second embodiment of the invention.

FIG. 8 schematically shows a structure of a main portion of a semiconductor memory device according to a second embodiment of the invention. In FIG. 8, memory blocks BK1–BKn are divided into a group including memory blocks BK1–BKj and a group including memory blocks BKk–BKn. Replacement IO program circuits RIP1–RIPn are provided corresponding to memory blocks BK1–BKn, respectively. Meanwhile, a replacement column address program circuit RAP1 is provided commonly to memory blocks BK1–BKj, and a replacement column address program circuit RAP2 is provided commonly to memory blocks BKk–BKn. Memory blocks BK1–BKn are commonly coupled to internal data bus DBB, and a memory block designated by block select signals BS1–BSn performs transmission of data to or from an input/output circuit IOK via internal data bus DBB. Input/output circuit IOK includes data input buffers 5a and 5b as well as data output buffers 6a and 6b shown in FIG. 1.

In FIG. 8, the address buffer for producing an internal address signal is not shown for simplicity reason. Internal row address signal X is applied commonly to memory blocks BK1–BKn, and internal column address signal Y is also applied commonly to memory blocks BK1–BKn. Internal column address signal Y is further applied to replacement column address program circuits RAP1 and RAP2.

Replacement column address program circuits RAP1 and RAP2 have the same internal structure as that shown in FIGS. 2 to 4. Replacement IO program circuits RIP1–RIPn have the same internal structure as the program circuit shown in FIG. 3. Each of replacement IO program circuits RIP1–RIPn includes IO program circuits corresponding in number to the bit width of internal data bus DBB. Each of memory blocks BK1–BKn has an internal structure the same as the conventional structure, and includes memory sub-blocks corresponding in number to the bit width of data bus DBB as well as the redundant column common to the memory sub-blocks.

In the structure shown in FIG. 8, replacement column address program circuits RAP1 and RAP2 can program defective column addresses for the group of memory blocks BK1–BKj and the group of memory blocks BKk–BKn independently of each other. Accordingly, the flexibility in programming of a defective column address is further improved.

In memory blocks BK1–BKn, use/non-use of the redundant column as well as the internal IO line pair to be connected to the used redundant column can be programmed by corresponding replacement IO program circuits RIP1–RIPn, respectively. By providing replacement column address program circuits RAP1 and RAP2 for the respective groups of the memory blocks, independent programming of a defective column address can be performed for each group of the memory blocks so that the flexibility in programming of a defective column address is improved, and the efficiency of repairing a defective column address and the product yield are improved. The replacement column address program circuits are only two in number, and the fusible elements required for programming a defective column address are small in number so that a time required for programming a defective column address can be reduced, which also improves the productivity.

[Third Embodiment]

Figure 9:
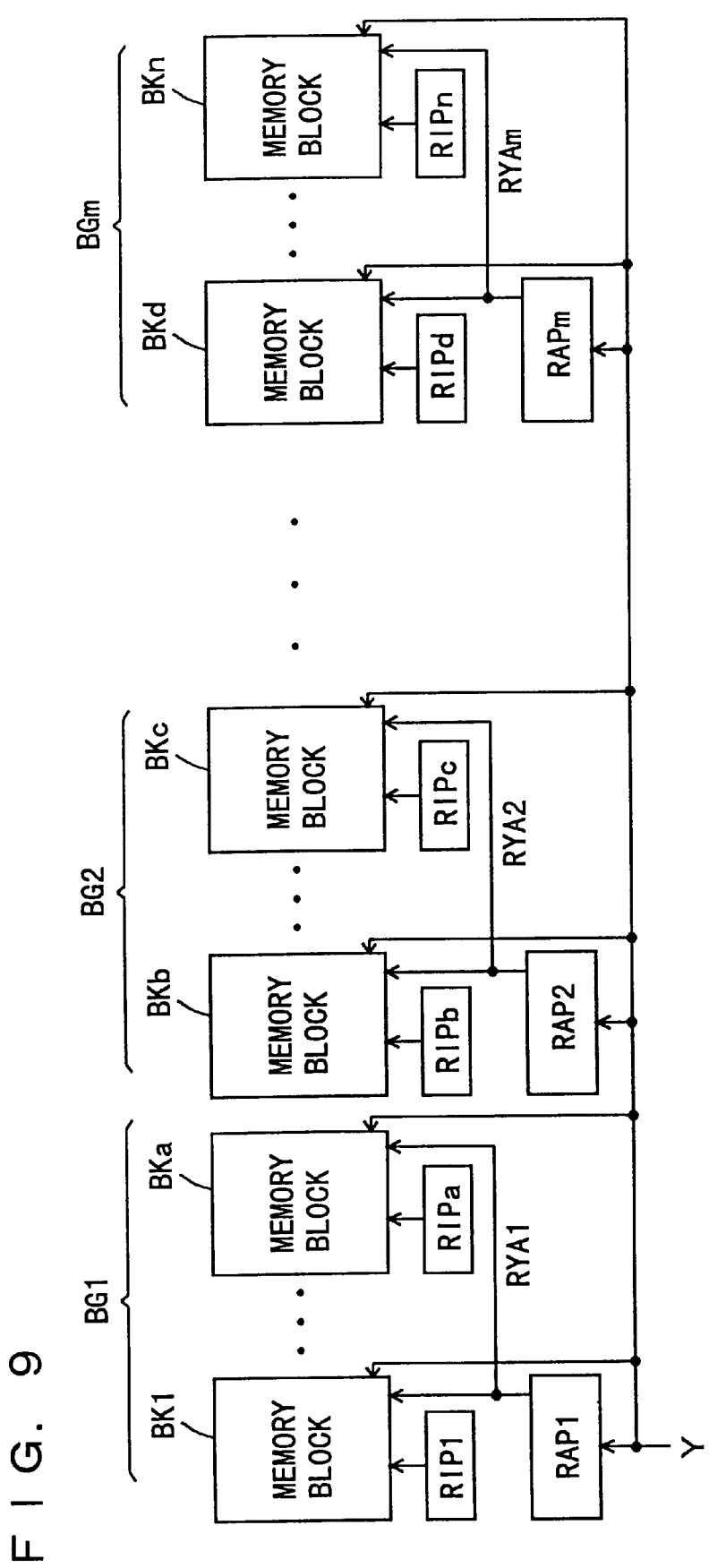
FIG. 9 schematically shows a structure of a main portion of a semiconductor memory device according to a third embodiment of the invention.

FIG. 9 schematically shows a structure of a main portion of a semiconductor memory device according to a third embodiment of the invention. In FIG. 9, memory blocks BK1–BKn are divided into a plurality of memory block groups BG1–BGm. More specifically, memory blocks BK1–BKa form a memory block group BG1, memory blocks BKb–BKc form a memory block group BG2, . . . , and memory blocks BKd–BKn form a memory block group BGm.

Replacement IO program circuits RIP1–RIPn are provided corresponding to memory block groups BK1–BKn, respectively. Replacement column address program circuits RAP1–RAPm are provided corresponding to memory block groups BG1–BGn, respectively. Redundant column access instructing signals RYA1–RYA2, . . . and RYAm generated from replacement column address program circuits RAP1–RAPm are applied to the memory blocks in corresponding memory block groups, respectively.

In the semiconductor memory device of the third embodiment of the invention, structures other than the above are the same as those of the first embodiment already described.

As shown in FIG. 9, replacement column address program circuits RAP1–RAPm are arranged corresponding to the memory block groups, respectively, whereby the flexibility in programming of a defective column address is further improved.

In memory blocks BK1–BKn, corresponding replacement IO program circuits RIP1–RIPn is subjected to the programming of use/non-use of the redundant column and the internal IO line pair to be connected, respectively. Since each of memory block groups BG1–BGm includes a plurality of memory blocks, replacement column address program circuits RAP can be reduced in number, and an area occupied by the program circuits can be reduced.

The number, m, of the memory block groups is smaller than the number, n, of the memory blocks. Each of memory block groups BG1–BGm may include an arbitrary number of memory blocks. However, as the number of memory block groups increases, the area occupied by the replacement column address program circuits increases. Accordingly, the number of memory block groups is appropriately determined depending on the flexibility in programming of a defective column address and the area occupied by the replacement column address program circuits. Accordingly, the number of the replacement column address program circuits can be increased only up to a limited value for suppressing increase in chip area.

According to the third embodiment of the invention, as described above, the memory blocks are divided into a plurality of memory block groups, and the replacement column address program circuit is provided for each memory block group. Therefore, the flexibility in programming of a defective column address can be improved, and the efficiency of repairing a defective column can be improved. Further, effects similar to those of the first and second embodiments can be achieved.

[Fourth Embodiment]

Figure 10:
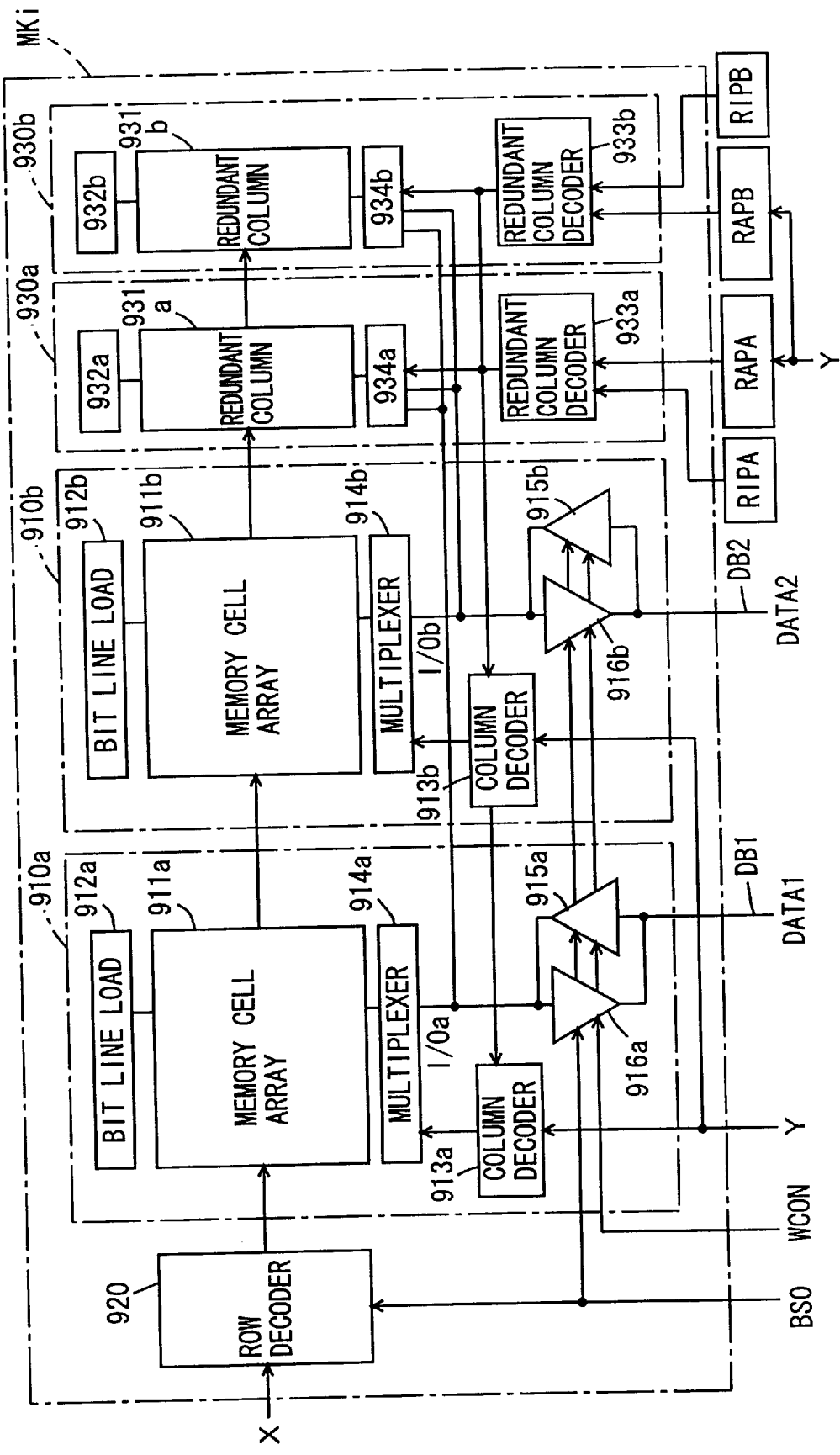
FIG. 10 schematically shows a structure of a memory block in a fourth embodiment of the invention.

FIG. 10 schematically shows a structure of one memory block in a semiconductor memory device according to a fourth embodiment of the invention. In FIG. 10, a memory block MKi includes two memory sub-blocks 910a and 910b as well as two redundant column blocks 930a and 930b. Memory sub-blocks 910a and 910b are provided corresponding to internal data line pairs DB1 and DB2, respectively. Each of redundant column blocks 930a and 930b includes one redundant column used for repairing a defective memory cell column in memory sub-block 910a or 910b. In each memory sub-block, therefore, up to two defective memory cell columns can be repaired by replacement.

Figure 19:
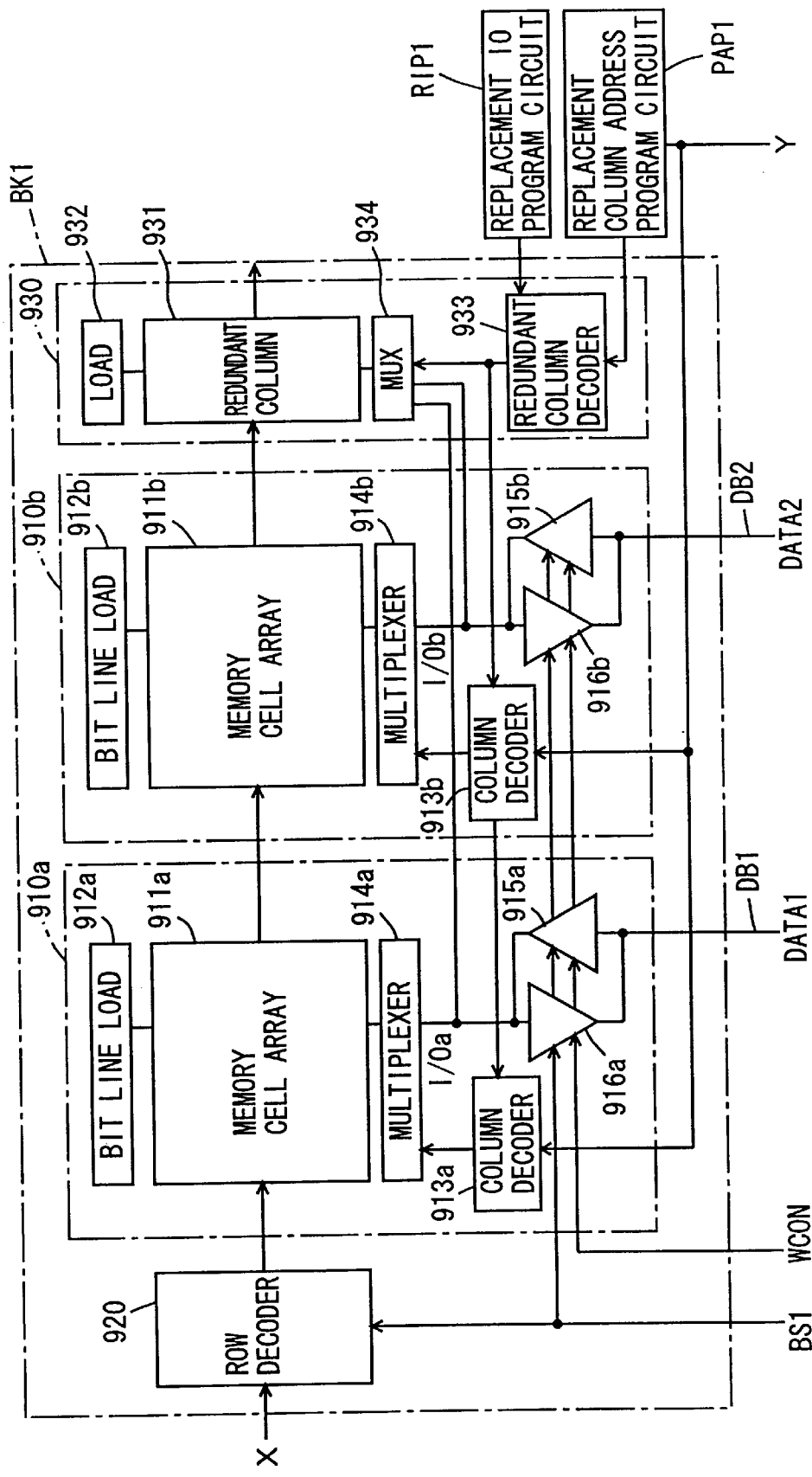
FIG. 19 schematically shows a structure of a memory block shown in FIG. 18.
Figure 20:
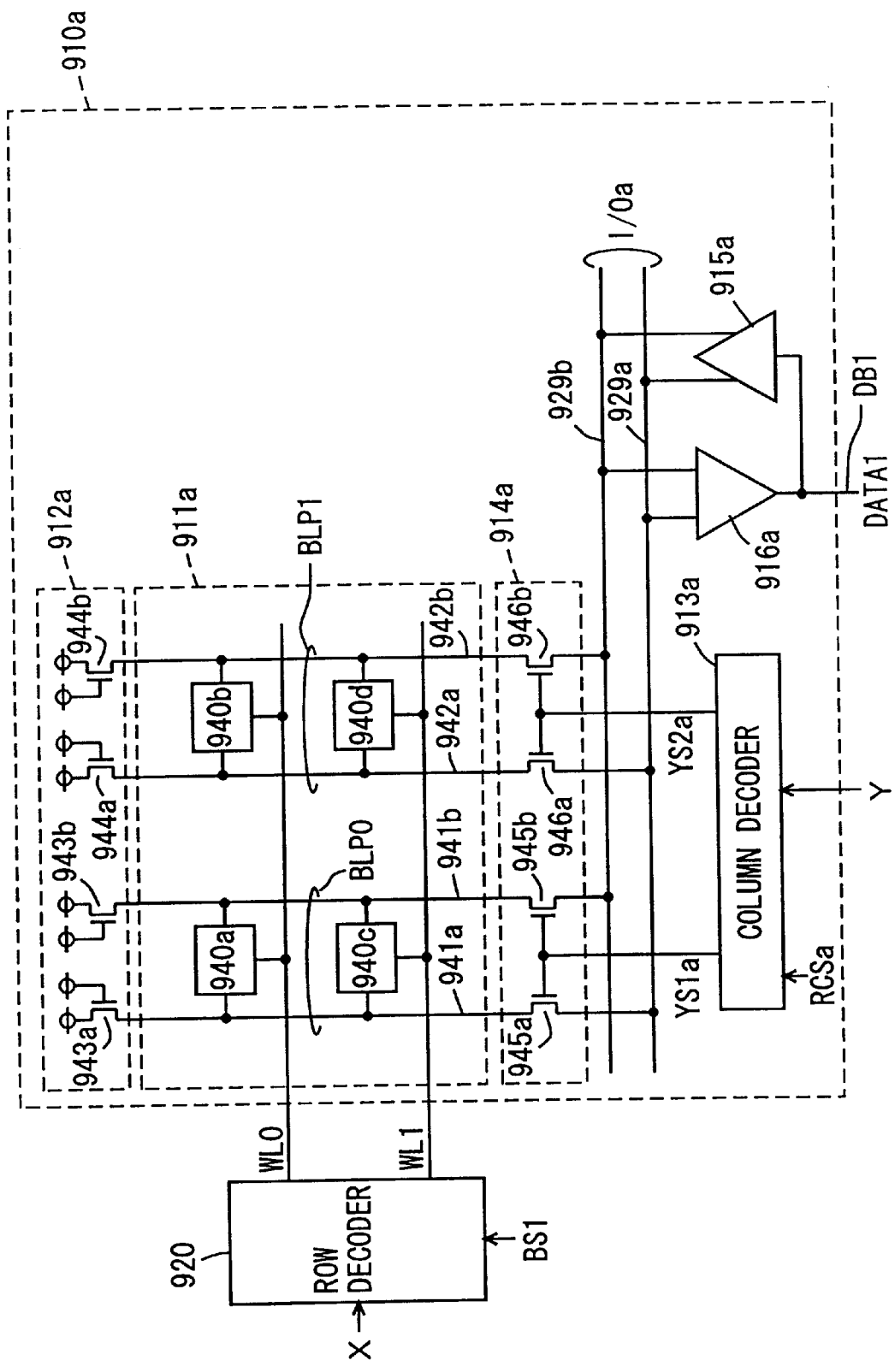
FIG. 20 shows a structure of a memory sub-block shown in FIG. 19.
Figure 21:
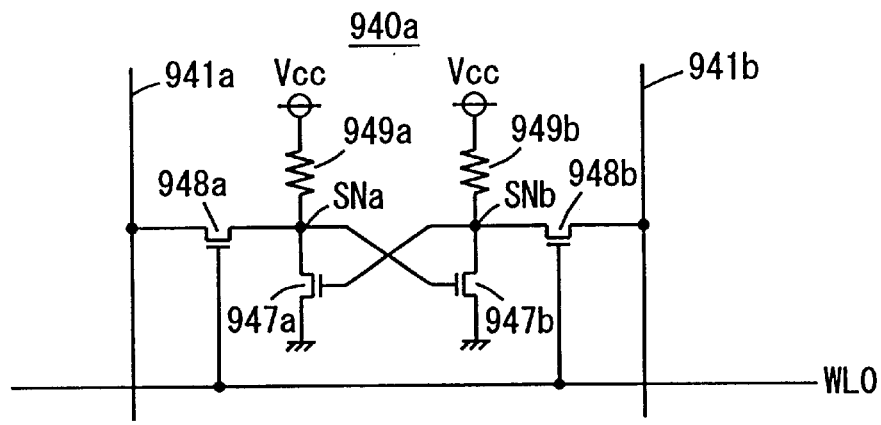
FIG. 21 shows an example of a structure of a memory cell shown in FIG. 20.
Figure 22:
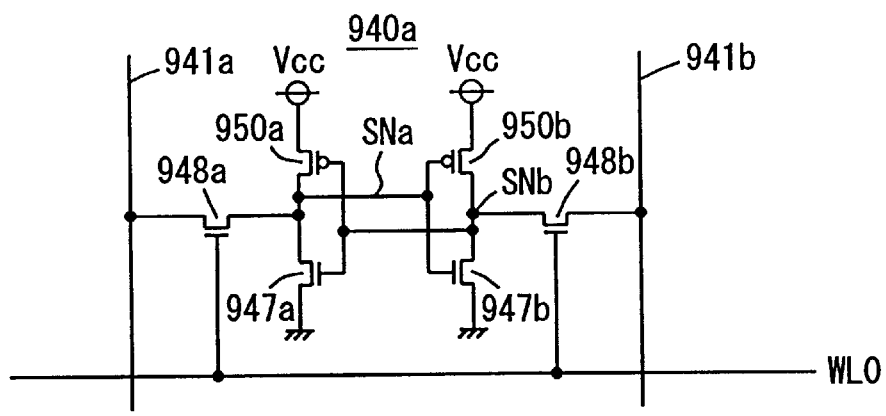
FIG. 22 schematically shows another structure of the memory cell shown in FIG. 20.
Figure 23:
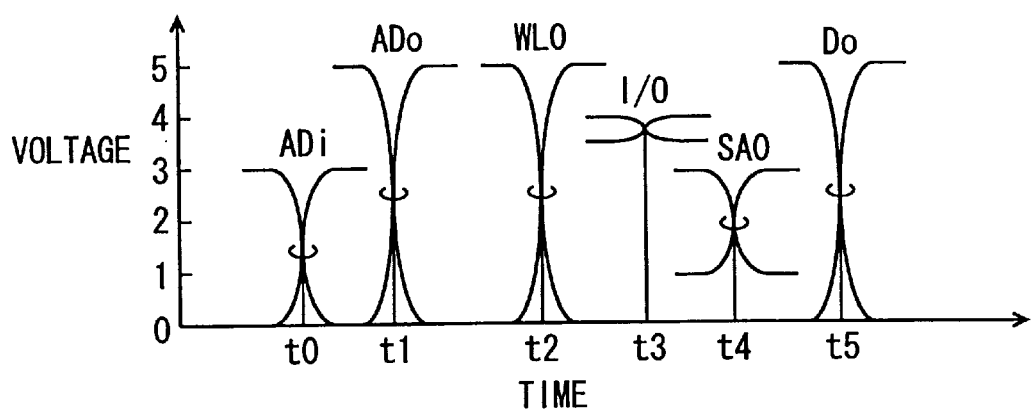
FIG. 23 shows operation waveforms for data reading of the conventional semiconductor memory device.

Memory sub-blocks 910a and 910b have the same structure as that shown in FIGS. 19 and 20. The portions corresponding to those in the conventional device bear the same reference numerals, and the description thereof will not be repeated.

Redundant column block 930a includes a redundant column 931a including redundant cells arranged in one column, a bit line load circuit 932a for supplying a column current to redundant column 931a, a redundant column decoder 933a for producing a redundant column select signal when redundant column 931a is used, and a multiplexer 934a for coupling redundant column 931a to one of internal IO line pairs I/Oa and I/Ob in accordance with the output signal of redundant column decoder 933a.

Redundant column block 930b likewise includes a redundant column 931b, a bit line load circuit 932b, a redundant column decoder 933b, and a multiplexer 934b.

For redundant column block 930a, there are provided a replacement IO program circuit RIPA and a replacement column address program circuit RAPA. Likewise, a replacement IO program circuit RIPB and a replacement column address program circuit RAPB are provided for redundant column block 930b.

Two redundant columns 931a and 931b are provided in memory block MKi. These redundant columns 931a and 931b are commonly supplied with a row select signal from row decoder 920. When it is found from a test that a defect is present in a certain memory cell column of memory cell array 911a, this defective memory cell column is functionally replaced with one of redundant columns 931a or 931b. For replacing the defective memory cell column with redundant column 931a, the defective column address indicating the position of the defective memory cell column is programmed by selectively blowing the fuses arranged in replacement column address program circuit RAPA. In this structure, replacement column address program circuits RAPA and RAPB as well as replacement IO program circuits RIPA and RIPB have the same structures as those shown in FIGS. 2 to 4. The internal IO line pair to be connected to the defective memory cell column is programmed by selectively blowing the fuses arranged in replacement IO program circuit RIPA. When access to the defective memory cell column in memory cell array 911a is requested, multiplexer 934a, instead of multiplexer 914a, connects redundant column 931a to corresponding IO line pair I/Oa.

For using redundant column 931b, the defective memory cell column address indicating the position of a defective memory cell column is programmed by selectively blowing the fuses arranged in replacement column address program circuit RAPB. The internal IO line pair to be connected to the defective memory cell column is programmed by selectively blowing the fuses arranged in replacement IO program circuit RIPB. When the defective memory cell column is addressed in the above case, redundant column 931b is connected to corresponding internal IO line pair I/Oa by redundant column decoder 933b and multiplexer 934b.

In the case where a defective memory cell column is present in memory cell array 911b, repairing is likewise performed by replacement using redundant column block(s) 930a and/or 930b.

Owing to provision of two redundant columns 931a and 931b in memory block MKi, it is possible to improve the efficiency of repairing a defective memory cell column as well as the flexibility in programming of a defective column address.

The structure of memory block MKi shown in FIG. 10 is employed for transferring data of 2 bits through the internal data bus. The number of memory sub-blocks increases in accordance with the bit width of the internal data bus, and the structures of selection paths of multiplexers 934a and 934b for a redundant column are expanded in accordance with the number of the internal IO line pairs. This is true also with respect to replacement IO program circuits RIPA and RIPB.

Figure 11:
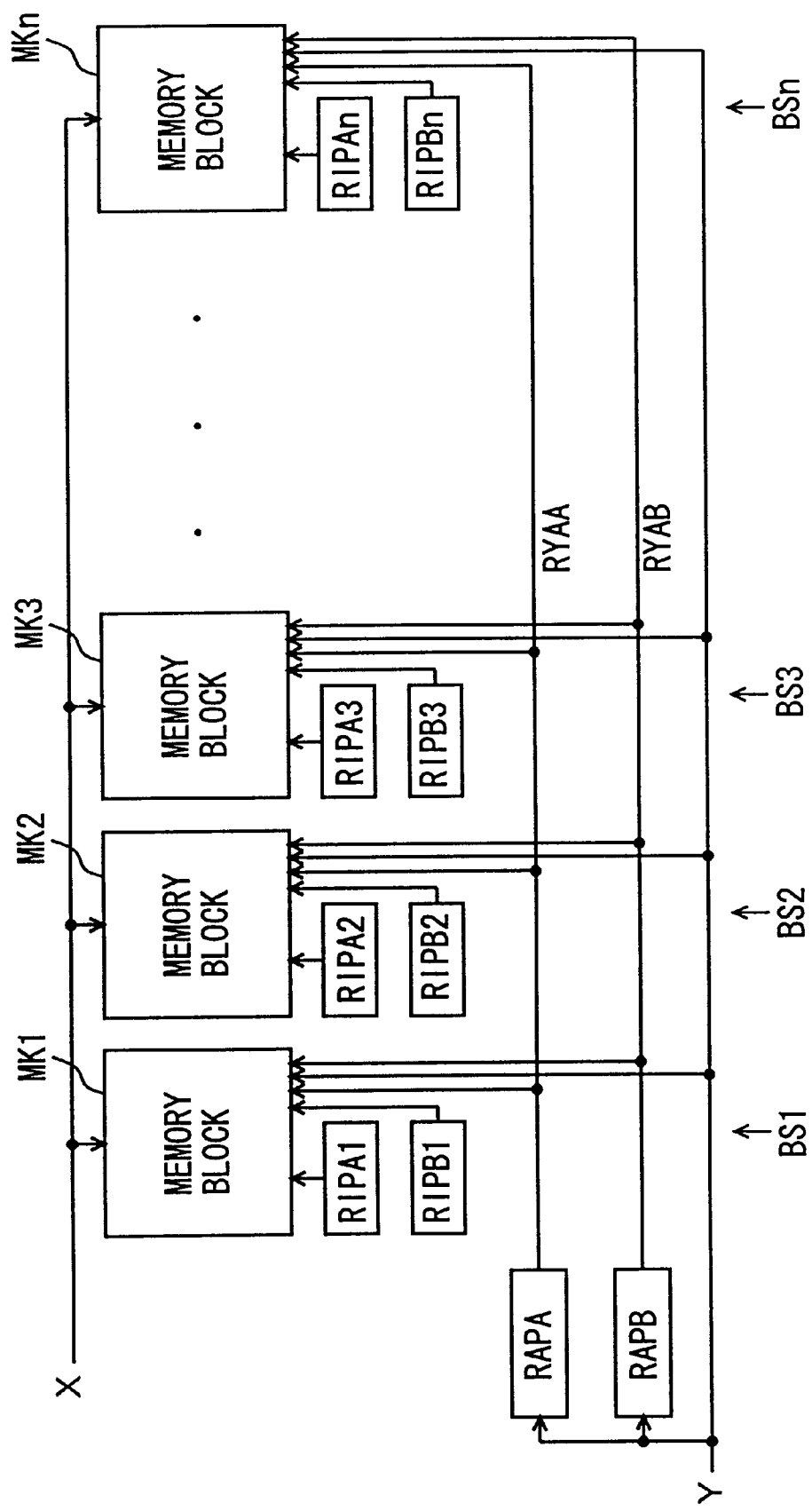
FIG. 11 schematically shows a structure of a main portion of a semiconductor memory device according to a fourth embodiment of the invention.

FIG. 11 schematically shows a structure of a main portion of a semiconductor memory device according to a fourth embodiment of the invention. In FIG. 11, the semiconductor memory device includes memory blocks MK1–MKn. Each of memory blocks MK1–MKn has a structure similar to that of memory block MKi shown in FIG. 10.

Replacement IO program circuits RIPA1–RIPAn as well as RIPB1–RIPBn are provided corresponding to memory blocks MK1–MKn, respectively. Structures of replacement IO program circuits RIPA1–RIPAn and RIPB1–RIPBn are the same as the foregoing structure shown in FIGS. 2 to 4. In each of memory blocks MK1–MKn, two replacement IO program circuits RIPA and RIPB are provided corresponding to two redundant columns, respectively, so that the programming of the replacement IO in each memory block can be performed independently of the other memory blocks.

Commonly to memory blocks MK1–MKn, there are arranged replacement column address program circuits RAPA and RAPB. Replacement column address program circuit RAPA cooperates with replacement IO program circuits RIPA–RIPAn to designate use/non-use of the redundant columns and the connecting IO, i.e., I/O to be connected in respective memory blocks ML1–MKn. Replacement column address program circuit RAPB cooperates with replacement IO program circuits RIPB–RIPBn to implement programming of use/non-use of the redundant column and the connecting IO in respective memory blocks ML1–MKn.

When a defective memory cell column is not present in memory blocks MK1–MKn, the IO program circuit included in each of corresponding replacement IO program circuits RIPA and RIPB is programmed to attain the state of non-use of the redundant column (the fuse element is kept conductive in the structure shown in FIG. 3).

Owing to provision of the two redundant columns in each of memory blocks MK1–MKn, it is possible to improve the efficiency of repairing a defective memory cell column as well as the flexibility in programming of a defective column address. Owing to provision of the replacement IO program circuit for each of memory blocks MK1–MKn, the programming of the replacement IO in each memory block can be performed independently of the other memory blocks, and the use/nonuse of the redundant column and the connecting I/O of the redundant column can be programmed independently of the other memory blocks so that the flexibility in programming of a defective column address program is improved.

Owing to provision of replacement IO program circuits RIPA and RIPB commonly to memory blocks MK1–MKn, an area occupied by these program circuits can be reduced. In the structure shown in FIG. 11, effects similar to those of the first and second embodiments can be achieved, and yield and productivity can be improved.

Although FIG. 11 does not show an internal data bus, the internal data bus is arranged commonly to memory blocks MK1–MKn, and data transfer is performed between a memory block designated by the block select signal (not shown) and the internal data bus.

[Fifth Embodiment]

Figure 12:
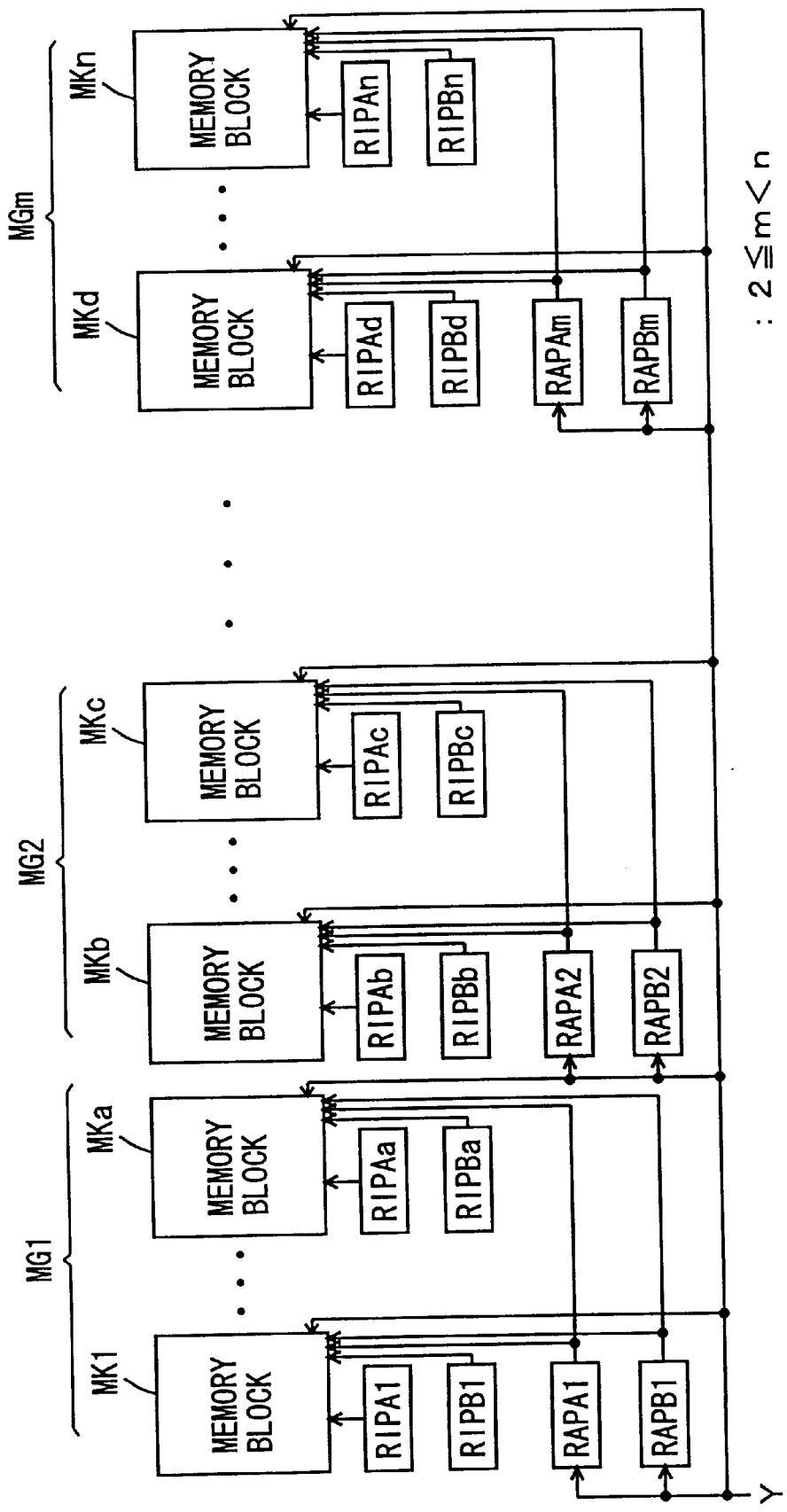
FIG. 12 schematically shows a structure of a main portion of a semiconductor memory device according to a fifth embodiment of the invention.

FIG. 12 schematically shows a structure of a main portion of a semiconductor memory device according to a fifth embodiment of the invention. In FIG. 12, each of memory blocks MK1–MKn includes two redundant columns, similarly to the foregoing fourth embodiment. Replacement 10 program circuits RIPA1–RIPAn as well as RIPB1–RIPBn are provided corresponding to memory blocks MK1–MKn, respectively. Owing to provision of two replacement IO program circuits RIPA and RIPB for each memory block MKi, use/non-use of the two redundant columns and the connecting I/O in each memory block can be programmed independently of the other memory blocks.

Memory blocks ML1–MKn are grouped into a plurality of memory block groups MG1–MGm. More specifically, memory blocks MK1–MKn form memory block group MG1, memory blocks MKb–MKc form a memory block group MG2, . . . , and memory blocks MKd–MKn form a memory block group MGm. For each of memory block groups MG1–MGm, there are arranged two replacement column address program circuits, i.e., the respective circuits RIPA1–RIPAm and the respective circuits RAPB1–RAPBm, where m satisfies a relationship of 2≦m<n.

By providing two replacement IO program circuits RIPA and RIPB for each memory block group, programming of a defective column address can be performed within a memory block group. Two defective column addresses can be programmed in each memory block MGi so that the flexibility in programming of a defective column address is significantly improved. Owing to provision of replacement IO program circuits RIPA1–RIPAn corresponding to memory blocks MK1–MKn, respectively, the redundant column is not used in a normal memory block. Accordingly, the flexibility in programming of the replacement IO is significantly improved as compared with the structure in which the replacement IO is programmed commonly to memory blocks MK1–MKn.

Since replacement column address program circuits RAPA1–RAPAm as well as RAPB1–RAPBm are provided corresponding to memory block groups MG1–MGm, respectively, the program circuits can be reduced in number, and the area occupied by the program circuits can be reduced. Thereby, in addition to the effect achieved by the fourth embodiment, improvement of the flexibility in programming of a defective column address can be achieved.

In the fifth embodiment of the invention, as memory block groups MG1–MGm increase in number, replacement column address program circuits RAPA1–RAPAm as well as RAPB1–RAPBm increase in number so that an area occupied by the program circuits increases, similarly to the foregoing embodiment. Accordingly, the number of memory block groups MG1–MGm can be increased only to a limited value in view of the flexibility in defective column address programming and the occupying area in the chip. The minimum number of memory block groups MG1–MGm is two for the case where memory blocks ML1–MKn are divided into two groups.

[Sixth Embodiment]

Figure 13:
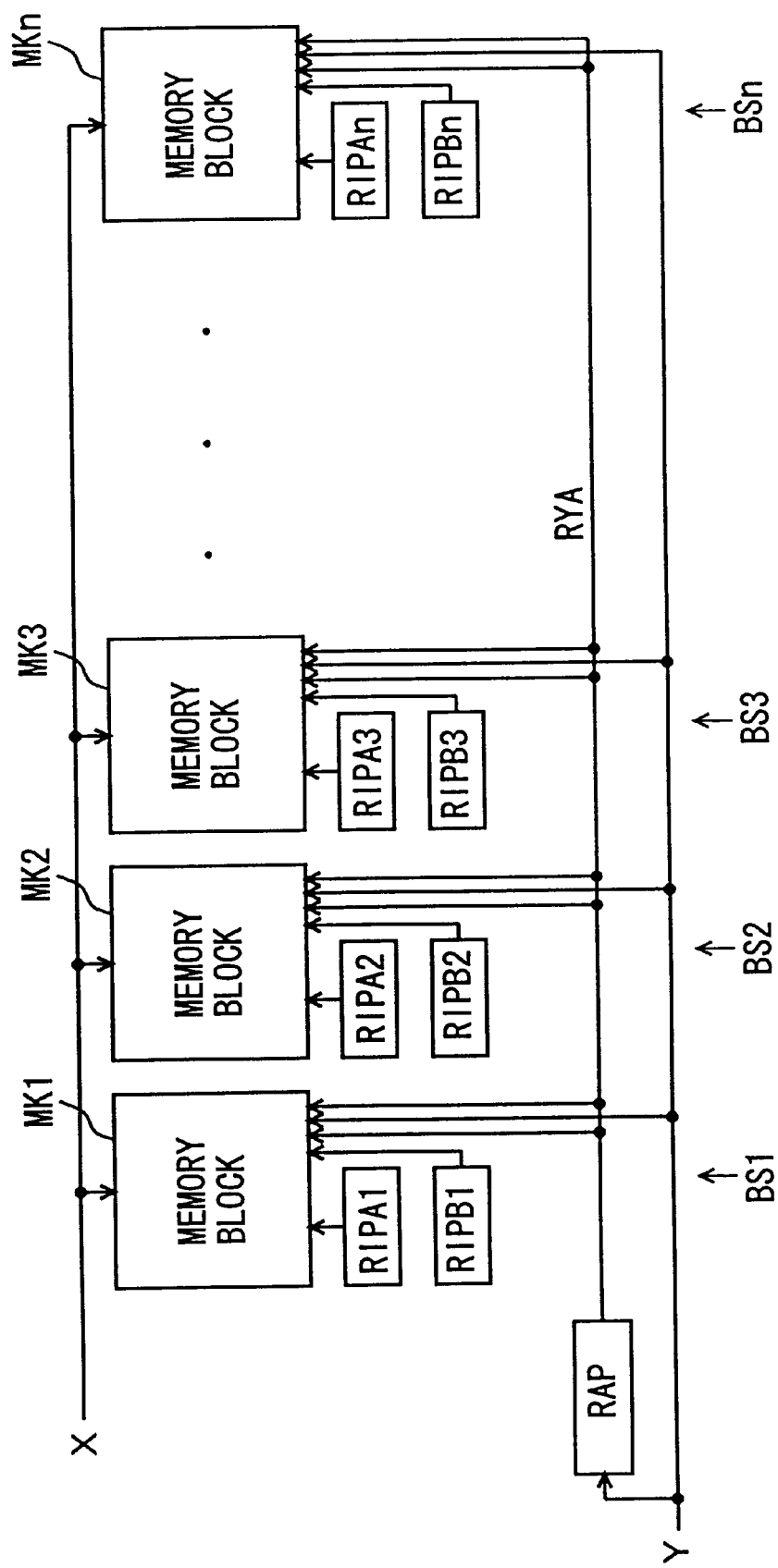
FIG. 13 schematically shows a structure of a main portion of a semiconductor memory device according to a sixth embodiment of the invention.

FIG. 13 schematically shows a structure of a main portion of a semiconductor memory device according to a sixth embodiment of the invention. In FIG. 13, replacement column address program circuits RAPA1–RAPAm as well as RAPB1–RAPBm are provided corresponding to memory blocks MK1–MKn, respectively. Similarly to the foregoing fourth embodiment, each of memory blocks ML1–MKn includes two redundant columns, and the programming of the replacement IO in each memory block can be performed independently of the other memory blocks.

The replacement column address program circuit RAP is provided commonly to memory blocks MK1–MKn, and redundant column access instructing signal RYA from replacement column address program circuit RAP is applied to memory blocks ML1–MKn. In memory block MKi, determination of use/non-use of the redundant column as well as selection of the replacement IO are executed by corresponding replacement IO program circuits RIPAi and RIPBi in accordance with redundant column access instructing signal RYA. For each memory block, the state of use of the redundant column can be programmed independently of the other memory blocks so that the flexibility in selection of the redundant column can be improved even in the case where a defective column address is programmed commonly to memory blocks ML1–MKn.

FIG. 14 schematically shows a programmed state of the memory block in the sixth embodiment of the invention. Each of memory blocks ML1–MKn has two redundant columns, and replacement column address program circuits RAPA1–RAPAn as well as replacement column address program circuits RAPB1–RAPBn are provided for the two replacement columns in the respective memory blocks. These memory blocks ML1–MKn are commonly supplied with redundant column access instructing signal RYA from replacement column address program circuit RAP shown in FIG. 13. Accordingly, a programmed defective column address is common to memory blocks ML1–MKn. For memory block MK1, replacement IO program circuits RIPA1 and RIPB1 use the two redundant columns for coupling to different internal IO line pairs.

In memory block MK2, replacement IO program circuits RIPA2 and RIPB2 use one redundant column, and the other redundant columns are not used. The used redundant column is connected to internal IO line pair I/Oa (in the case where the internal data bus has a width of two bits). For memory blocks MK3, replacement IO program circuits RIPA3 and RIPB3 use one redundant column, and the used redundant column is connected to internal IO line pair I/Ob (in the case where the internal data bus has a width of two bits).

In memory block MKn, replacement IO program circuits RIPAn and RIPBn set the redundant columns to the unused state, and replacement with the redundant columns is not executed in memory block MKn.

Accordingly, even if a defective column address to be programmed is common to memory blocks MK1–MKn, the states of selection of the redundant columns in the respective memory blocks can be programmed independently of each other by providing replacement IO program circuits RIP1–RIPAn as well as RIPB1–RIPBn corresponding to memory blocks MK1–MKn, respectively. Thereby, the flexibility in state of use of the redundant columns is improved.

This sixth embodiment employs only one replacement column address program circuit RAP for the case where two redundant columns are provided in each memory block. Therefore, the area occupied by circuits for programming a defective column address can be reduced.

[Seventh Embodiment]

Figure 15:
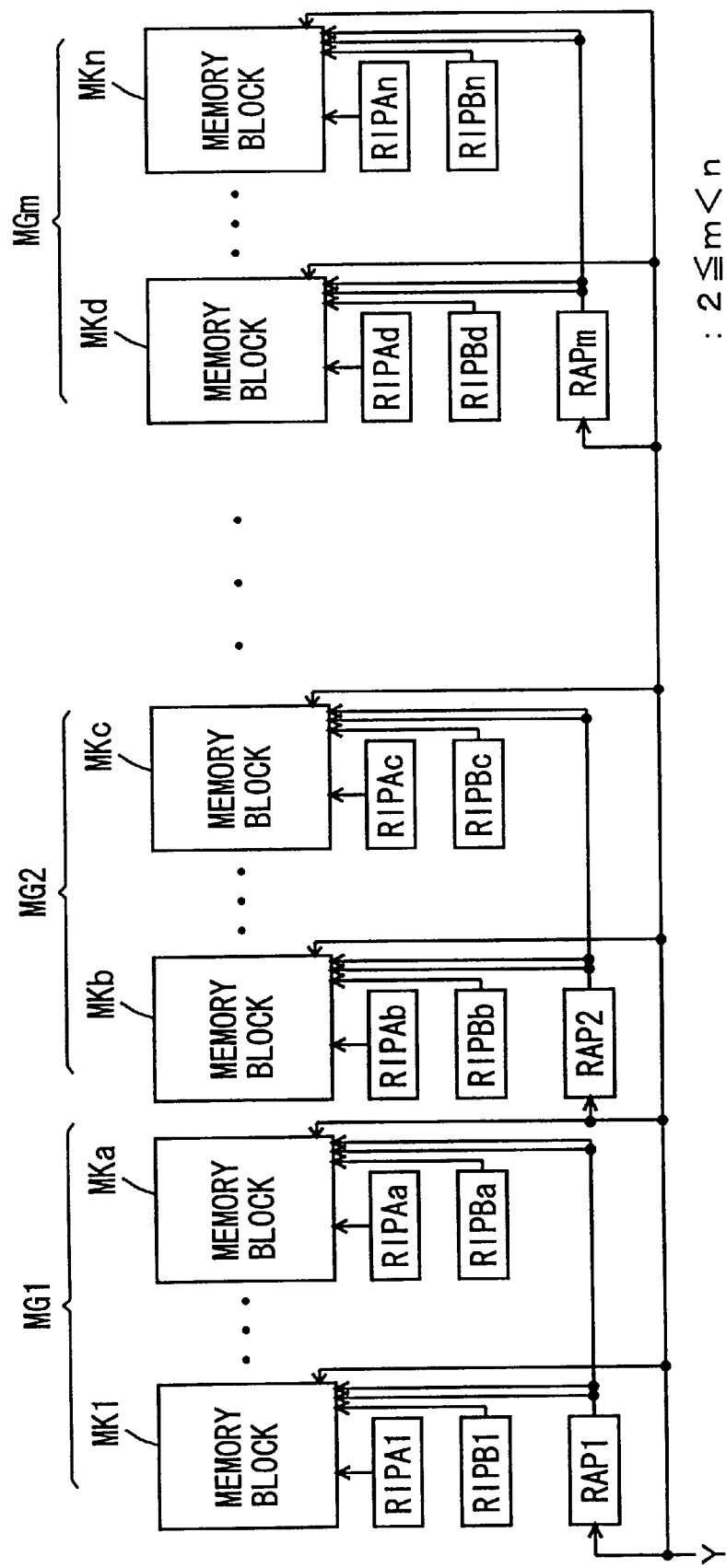
FIG. 15 schematically shows a structure of a main portion of a semiconductor memory device according to a seventh embodiment of the invention.

FIG. 15 schematically shows a structure of a main portion of a semiconductor memory device according to a seventh embodiment of the invention. In FIG. 15, memory blocks ML1–MKn are divided into a plurality of memory block groups MG1–MGm. Each of memory blocks ML1–MKn has the same structure as that shown in FIG. 10. Corresponding to memory blocks MK1–MKn, there are provided replacement IO program circuits RIPA1–RIPAn as well as replacement IO program circuits RIPB1–RIPBn, respectively. Two replacement IO program circuits RIPAi and RIPBi are provided for each memory block MKi.

Corresponding to memory block groups MG1–MGm, there are arranged replacement column address program circuits RAP1, RAP2, . . . and RAPm. Thus, programming of a replacement column address for each of memory block groups MG1–MGm can be performed independently of the others. Such independent programming of a replacement column address for each memory block group improves the flexibility in programming of a replacement column address.

The state of use of the redundant column in each memory block can be achieved by employing the structure shown in FIG. 14 for each memory group including the memory blocks. More specifically, a replacement column address is programmed for memory blocks MK1–MKa, a replacement column address is programmed commonly to memory blocks MKb–MKc, and a replacement column address is programmed commonly to memory blocks MKd–MKn. Each programmed replacement column address is common to the memory blocks in the corresponding memory block group, and the state or manner of use of the redundant column in each memory block can be selectively determined by replacement IO program circuits RIPA and RIPB.

Accordingly, use/non-use of the redundant column as well as the connecting I/O can be programmed for each memory block in the memory block group so that the flexibility in programming of the state of use of the redundant columns can be improved as compared with the structure including the replacement IO program which is common to the memory blocks in the memory block group.

Since the replacement column address program circuits are provided corresponding to memory block groups MG1–MGm, an area occupied by the replacement column address program circuits can be reduced as compared with the structure in which replacement column address program circuits are employed corresponding to the respective memory blocks. Further, an effect similar to that achieved by the fourth embodiment can be achieved, and the production yield and productivity can be improved.

In the seventh embodiment, the number, m, of memory block groups MG1–MGm is appropriately determined in view of the area occupied by the column address program circuits and the flexibility of the replacement column address program (efficiency of use of the redundant columns), similarly to the foregoing embodiments. However, the memory block groups divided into two or more groups, but can be divided into only a limited number.

[Eighth Embodiment]

Figure 16:
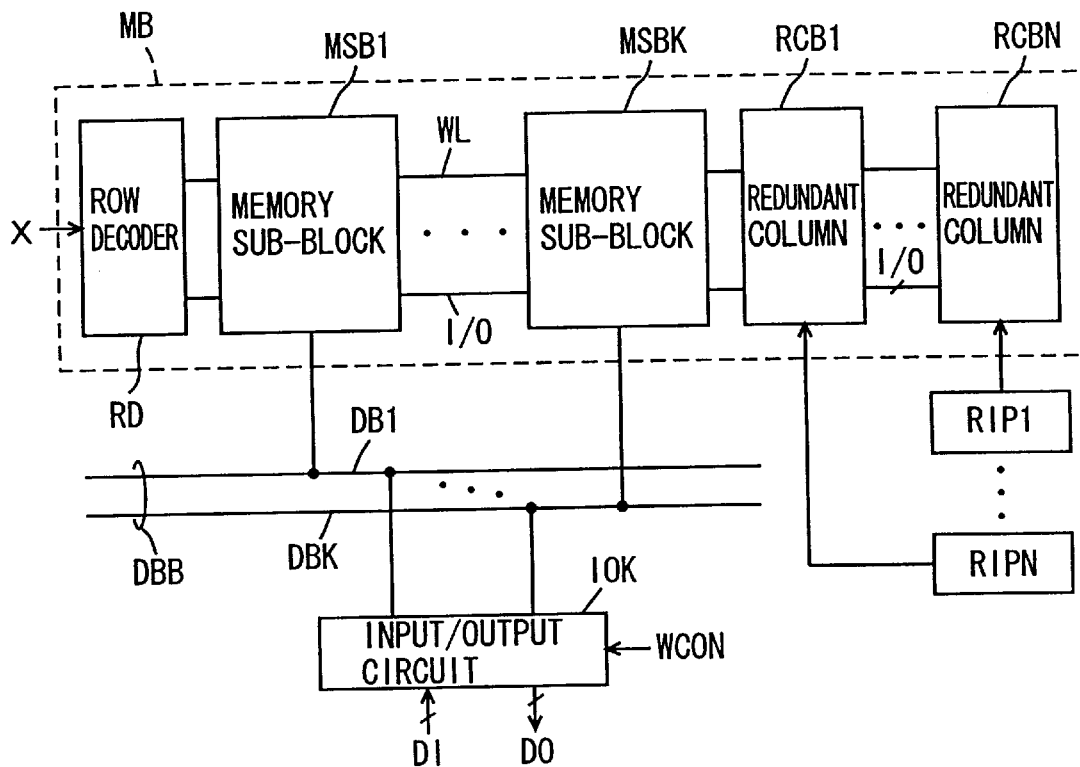
FIG. 16 schematically shows a structure of a main portion of a semiconductor memory device according to an eighth embodiment of the invention.

FIG. 16 schematically shows a structure of a main portion of a semiconductor memory device according to an eighth embodiment of the invention. FIG. 16 shows a structure of one memory block MB as a representative. Memory block MB includes K memory sub-blocks MSB1–MSBK as well as N redundant column blocks RCB1–RCBN. Memory sub-blocks MSB1–MSBK has structures similar to the foregoing structure shown in FIG. 20, and each of redundant column blocks RCB1–RCBN has a structure similar to that shown in FIG. 24.

Memory sub-blocks MSB1–MSBK are coupled to internal data line pairs DB1–DBK included in data bus DBB, respectively. Internal data bus DBB is coupled to input/output circuit IOK, which in turn is selectively activated in response to write control signal WCON.

Replacement 10 program circuits RIP1–RIPN are provided corresponding to redundant column blocks RCB1–RCBN, respectively. In accordance with the states of programming of these replacement IO program circuits RIP1–RIPN, use/non-use of the redundant columns of redundant column blocks RCB1–RCBN as well as the connecting IOs are determined. In this embodiment, N satisfies a relationship of (1≦N≦K).

The structure shown in FIG. 16 includes N redundant columns, and therefore the efficiency of repairing a defective column can be improved. Memory sub-blocks MSB1–MSBK are provided corresponding to internal data line pairs DB1–DBK, respectively. Memory sub-blocks MSB1–MSBK as well as redundant column blocks RCB1–RCBN are commonly supplied with the word line select signal from row decoder RD.

In the structure shown in FIG. 16, since each redundant column address program circuit is provided for a predetermined number of memory blocks, the area occupied by the program circuits can be reduced, and the state of use of the redundant columns can be programmed independently in each block so that the flexibility in programming is improved.

The replacement column address program circuit may be provided commonly to all the memory blocks, or may be provided for each memory block group.

Figure 17A:
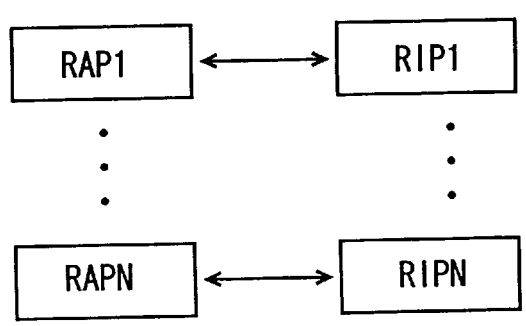
FIGS. 17A and 17B schematically show relationships between redundant column address program circuits and redundant IO program circuits in the eighth embodiment of the invention.

FIG. 17A shows a relationship between the replacement column address program circuits and the replacement IO program circuits in the eighth embodiment of the invention. In FIG. 17A, replacement column address program circuits RAP1–RAPN are provided for each predetermined number of memory blocks. These replacement column address program circuits RAP1–RAPN are provided corresponding to replacement IO program circuits RIP1–RIPN provided for each memory block MB. In this case, therefore, programming of the redundant columns can be independently performed for each predetermined number of memory blocks (i.e., for all the memory blocks or for each memory cell block group).

Figure 17B:
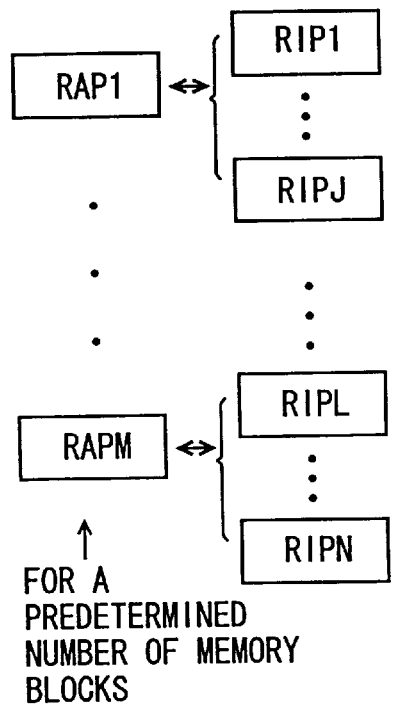

FIG. 17B shows another example of the relationship between the replacement column address program circuits and the replacement IO program circuits. In FIG. 17B, replacement IO program circuits RIP1–RIPN form a plurality of groups in one memory block MB, and replacement column address program circuits RAP1–RAPM are provided corresponding to the groups, respectively. In FIG. 17B, replacement column address program circuit RAP1 is provided for replacement IO program circuits RIP1–RIPJ, and replacement column address program circuit RAPM is provided for replacement IO program circuits RIPL–RIPN.

Since the replacement column address program circuit is provided for each group of the replacement IO program circuits, it is possible to reduce the number of replacement column address program circuits and the area occupied thereby. The number M of the groups of replacement IO program circuits RIP1–RIPn is one or more, but does not exceed N.

By utilizing the structures shown in FIGS. 17A and 17B, efficient use of the redundant columns can be achieved, and the area occupied by the circuits can be reduced.

According to this eighth embodiment, in the case where the plurality of redundant columns are provided in a memory block, the replacement IO program circuits are provided corresponding to the respective redundant column blocks, and one or more replacement column address program circuit(s) is provided for all the memory blocks or each predetermined number of memory blocks in each memory block group. Thereby, the efficiency of use of the redundant columns is improved, and the production yield is improved. Also, the area occupied by the program circuits can be reduced. Further, the number of the program circuits is reduced, and the steps for defective column address programming can be reduced in number, and the productivity can be improved.

[Other Examples of Application]

The SRAM has been described as an example of the semiconductor memory device. However, the invention can be applied to various structures provided that the memory block is divided into sub-blocks corresponding to data bits, respectively, and redundant columns are used in memory blocks independently. The invention can be likewise applied to another semiconductor memory device such as a DRAM or a flash memory.

According to the first to eighth embodiments described above, the memory block is divided into memory sub-blocks corresponding to the internal data line pairs. However, the memory sub-blocks may be dispersed in one memory block. For example, such a structure may be employed that one column select line selects the columns corresponding to the respective internal data bits.

According to the invention, as described above, the replacement IO program circuits are provided corresponding to the memory blocks, and the redundant column address program circuits are smaller in number than the replacement IO program circuits. Therefore, the area occupied by the program circuits can be reduced, and the production yield and the productivity can be improved without significantly reducing the flexibility in programming of a defective column address.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of data terminals;
   a plurality of internal data lines provided corresponding to said plurality of data terminals, respectively;
   a plurality of memory blocks each including memory cells arranged in rows and columns and a redundant cell column for repairing a defective memory cell in at least one column;
   a plurality of normal column select circuits provided corresponding to said plurality of memory blocks, each normal column select circuit for simultaneously selecting a plurality of memory cells from a corresponding memory block and coupling selected memory cells to said plurality of internal data lines, respectively;
   a plurality of replacement IO program circuits provided corresponding to said plurality of memory blocks, for storing IO addresses specifying the internal data lines to be connected to the redundant cell columns in corresponding memory blocks;
   at least one replacement column address program circuit each provided commonly to a predetermined number of memory arrays among said plurality of memory arrays for storing a defective column address indicating a defective memory cell column in said predetermined number of memory blocks; and
   a plurality of redundant column select circuits provided corresponding to said plurality of memory blocks, each redundant column select circuit coupled to a corresponding replacement IO program circuit and a corresponding replacement column address program circuit for selecting the redundant cell column in a corresponding memory block when an applied address indicates the defective memory cell column in the corresponding memory block.

2. The semiconductor memory device according to claim 1, wherein
   said predetermined number of memory blocks include said plurality of memory blocks.

3. The semiconductor memory device according to claim 1, wherein
   said plurality of memory blocks are divided into a plurality of groups each having said predetermined number of memory blocks, and the replacement column address program circuits are provided corresponding to said groups, respectively.

4. The semiconductor memory device according to claim 1, wherein
   the replacement column address program circuit is provided in plurality for said predetermined number of memory blocks.

5. The semiconductor memory device according to claim 1, wherein
   the replacement IO program circuit is provided in plurality for each of the memory blocks.

6. The semiconductor memory device according to claim 1, wherein
   each memory array include a plurality of the redundant cell columns,
   said replacement column address program circuit is provided corresponding to each of said plurality of the redundant cell columns with respect to each of said memory blocks, and
   the replacement IO program circuit is provided corresponding to each of said plurality of the redundant cell columns in each memory block.

7. The semiconductor memory device according to claim 1, wherein
   the replacement column address program circuit(s) provided for said predetermined number of memory blocks is no greater in number than said the internal data lines.

8. The semiconductor memory device according to claim 1, wherein
   the number of the replacement column address program circuit(s) is smaller than a total number of the replacement IO program circuits.

9. The semiconductor memory device according to claim 1, wherein
   each of the memory blocks includes a plurality of redundant cell columns, the replacement IO program circuit is provided corresponding to each of the redundant cell columns in the corresponding memory array, and the replacement column address program circuit is provided for a predetermined number of said replacement IO program circuits with respect to each of the memory blocks.

* * * * *